(12) United States Patent
Fukuzawa et al.

(10) Patent No.: US 8,917,485 B2
(45) Date of Patent: Dec. 23, 2014

(54) MAGNETORESISTIVE EFFECT ELEMENT, MAGNETIC HEAD, AND MAGNETIC DISK APPARATUS

(75) Inventors: Hideaki Fukuzawa, Kawasaki (JP); Yoshinari Kurosaki, Kawasaki (JP); Hiromi Yuasa, Kawasaki (JP); Yoshihiko Fuji, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1572 days.

(21) Appl. No.: 11/546,975

(22) Filed: Oct. 13, 2006

(65) Prior Publication Data
US 2007/0223150 A1 Sep. 27, 2007

(30) Foreign Application Priority Data
Mar. 27, 2006 (JP) ................ P2006-086422

(51) Int. Cl.
| | | |
|---|---|---|
| G11B 5/33 | (2006.01) | |
| G01R 33/09 | (2006.01) | |
| G11B 5/39 | (2006.01) | |
| G11C 11/16 | (2006.01) | |
| H01L 43/08 | (2006.01) | |
| H01F 10/32 | (2006.01) | |
| B82Y 25/00 | (2011.01) | |
| G11B 5/455 | (2006.01) | |

(52) U.S. Cl.
CPC ............ *G11B 5/3903* (2013.01); *G01R 33/093* (2013.01); *G11C 11/16* (2013.01); *H01L 43/08* (2013.01); *H01F 10/3254* (2013.01); *G11B 5/455* (2013.01); *G11B 5/398* (2013.01); *B82Y 25/00* (2013.01); *H01F 10/3272* (2013.01)

USPC ................... 360/324.1; 360/324.11

(58) Field of Classification Search
USPC ......................... 360/324.11, 324.1
See application file for complete search history.

(56) References Cited

U.S. PATENT DOCUMENTS

| | | |
|---|---|---|
| 5,608,593 A | 3/1997 | Kim et al. |
| 6,080,445 A | 6/2000 | Sugiyama et al. |
| 6,169,303 B1 | 1/2001 | Anthony |

(Continued)

FOREIGN PATENT DOCUMENTS

| | | |
|---|---|---|
| CH | 1431651 | 7/2003 |
| CN | 1419232 | 5/2003 |

(Continued)

OTHER PUBLICATIONS

M. Takagishi, et al., "The Applicability of CPP-GMR heads for Magnetic Recording", IEEE Transactions on Magnetics, vol. 38, No. 5, Sep. 2002; pp. 2277-2282.

(Continued)

*Primary Examiner* — Wayne Young
*Assistant Examiner* — Carlos E Garcia
(74) *Attorney, Agent, or Firm* — Nixon & Vanderhye, P.C.

(57) ABSTRACT

A magnetoresistive effect element includes a magnetization fixed layer including a first crystal grain, having a magnetization direction which is fixed substantially in one direction, a spacer layer arranged on the magnetization fixed layer and having an insulating layer and a metal conductor penetrating the insulating layer, and a magnetization free layer including a second crystal grain, arranged on the spacer layer to oppose the metal conductor and having a magnetization direction which changes corresponding to an external magnetic field.

20 Claims, 11 Drawing Sheets

(56) References Cited

U.S. PATENT DOCUMENTS

| | | | |
|---|---|---|---|
| 6,313,973 | B1 | 11/2001 | Fuke et al. |
| 6,411,476 | B1 | 6/2002 | Lin et al. |
| 6,452,763 | B1 | 9/2002 | Gill |
| 6,511,855 | B2 | 1/2003 | Anthony |
| 6,686,068 | B2 | 2/2004 | Carey et al. |
| 6,707,649 | B2 | 3/2004 | Hasegawa et al. |
| 6,775,111 | B2 | 8/2004 | Lin et al. |
| 6,781,799 | B2 | 8/2004 | Seyama et al. |
| 6,784,509 | B2 | 8/2004 | Yuasa et al. |
| 6,785,103 | B2 | 8/2004 | Cornwell et al. |
| 6,788,499 | B2 | 9/2004 | Lin et al. |
| 6,833,981 | B2 | 12/2004 | Suwabe et al. |
| 6,927,952 | B2 | 8/2005 | Shimizu et al. |
| 6,937,447 | B2 | 8/2005 | Okuno et al. |
| 6,961,224 | B2 | 11/2005 | Pinarbasi |
| 7,002,781 | B2 | 2/2006 | Sugawara |
| 7,071,522 | B2 | 7/2006 | Yuasa et al. |
| 7,116,529 | B2 | 10/2006 | Yoshikawa et al. |
| 7,180,714 | B2 | 2/2007 | Gill |
| 7,218,484 | B2 | 5/2007 | Hashimoto et al. |
| 7,221,545 | B2 | 5/2007 | Gill |
| 7,223,485 | B2 | 5/2007 | Yuasa et al. |
| 7,331,100 | B2 | 2/2008 | Li et al. |
| 7,336,453 | B2 | 2/2008 | Hasegawa et al. |
| 7,379,278 | B2 | 5/2008 | Koui et al. |
| 7,390,529 | B2 | 6/2008 | Li et al. |
| 7,426,098 | B2 | 9/2008 | Yuasa et al. |
| 7,443,004 | B2 | 10/2008 | Yuasa et al. |
| 7,522,390 | B2 * | 4/2009 | Yuasa et al. ............... 360/324.1 |
| 7,525,776 | B2 | 4/2009 | Fukuzawa et al. |
| 2002/0048127 | A1 | 4/2002 | Fukuzawa et al. |
| 2002/0048128 | A1 | 4/2002 | Kamiguchi et al. |
| 2002/0051380 | A1 | 5/2002 | Kamiguchi et al. |
| 2002/0097538 | A1 | 7/2002 | Seyama et al. |
| 2002/0114974 | A1 * | 8/2002 | Carey et al. ............... 428/692 |
| 2002/0150791 | A1 | 10/2002 | Yuasa et al. |
| 2002/0151791 | A1 | 10/2002 | Nozaki et al. |
| 2003/0123200 | A1 | 7/2003 | Nagasaka et al. |
| 2003/0128481 | A1 | 7/2003 | Seyama et al. |
| 2004/0021990 | A1 | 2/2004 | Koui et al. |
| 2004/0201929 | A1 | 10/2004 | Hashimoto et al. |
| 2005/0073778 | A1 * | 4/2005 | Hasegawa et al. ......... 360/324.1 |
| 2005/0157433 | A1 | 7/2005 | Kamiguchi et al. |
| 2005/0168887 | A1 | 8/2005 | Yuasa et al. |
| 2005/0219769 | A1 * | 10/2005 | Shimura et al. ............ 360/324.2 |
| 2006/0003185 | A1 | 1/2006 | Parkin |
| 2006/0034022 | A1 | 2/2006 | Fukuzawa et al. |
| 2006/0050444 | A1 | 3/2006 | Fukuzawa et al. |
| 2006/0077596 | A1 | 4/2006 | Yuasa et al. |
| 2006/0098353 | A1 * | 5/2006 | Fukuzawa et al. ......... 360/324.1 |
| 2006/0098356 | A1 * | 5/2006 | Hoshino et al. ........... 360/324.11 |
| 2006/0114620 | A1 * | 6/2006 | Sbiaa et al. ............... 360/324.12 |
| 2006/0164764 | A1 | 7/2006 | Kamiguchi et al. |
| 2006/0181814 | A1 | 8/2006 | Koui et al. |
| 2007/0014054 | A1 | 1/2007 | Zhang et al. |
| 2007/0223150 | A1 | 9/2007 | Fukuzawa et al. |

FOREIGN PATENT DOCUMENTS

| | | |
|---|---|---|
| CN | 1801332 A | 7/2006 |
| EP | 877398 A2 * | 11/1998 |
| EP | 1 548 762 | 6/2005 |
| JP | 11-86229 | 3/1999 |
| JP | 2002-76473 | 3/2002 |
| JP | 2002-157711 | 5/2002 |
| JP | 2002-208744 | 7/2002 |
| JP | 2003-60263 | 2/2003 |
| JP | 2004-153248 | 5/2004 |
| JP | 2005-191312 | 7/2005 |
| JP | 2006-135253 | 5/2006 |

OTHER PUBLICATIONS

K. Nagasaka et al., "Giant magnetoresistance properties of specular spin valve films in a current perpendicular to plane structure", Journal of Applied Physics, vol. 89, No. 11, Jun. 1, 2001, pp. 6943-6345.

H. Yuasa et al., "Output enhancement of spin-valve giant magnetoresistance in current-perpendicular-to-plane geometry", Journal of Applied Physics, vol. 92, No. 5, Spe. 1, 2002, pp. 2646-2650.

Hideaki Fukuzawa, et al., "MR Ratio Enhancement by NOL Current Confined-Path Structures in CPP Spin Valves", IEEE Transactions on Magnetics, vol. 40, No. 4, Jul. 2004, pp. 2236-2238.

Office Action in Chinese Application No. 2007100896993 dated Dec. 5, 2008 and partial English-language translation thereof.

Fukuzawa et al., "Nanoconstricted structure for current-confined path in current-perpendicular-to-plane spin valves with high magnetoresistance", Journal of Applied Physics 97, 10C509, 2005.

Office Action in Chinese Application No. 2007100896993 dated Jun. 19, 2009 and English-language translation thereof.

Office Action dated Aug. 24, 2010 in Japanese Patent Application No. 2006-086422, and partial English-language translation thereof.

Fukuzawa et al., U.S. Appl. No. 11/269,878, filed Nov. 9, 2005.

* cited by examiner

MAGNETORESISTIVE EFFECT ELEMENT, MAGNETIC HEAD, AND MAGNETIC DISK APPARATUS

CROSS-REFERENCE TO THE INVENTION

This application is based upon and claims the benefit of priority from the prior Japanese Patent Application No. 2006-086422, filed on Mar. 27, 2006; the entire contents of which are incorporated herein by reference.

BACKGROUND OF THE INVENTION

1. Field of the Invention

The present invention relates to a magnetoresistive effect element, a magnetic head, and a magnetic disk apparatus which pass a sense current in a direction perpendicular to the film face of a magnetoresistive effect film to detect magnetism.

2. Description of the Related Art

By means of giant magneto-resistive effect (GMR), performance of magnetic devices, magnetic heads in particular, has been rapidly improved. Especially, application of a spin-valve (SV) film to a magnetic head, an MRAM (Magnetic Random Access Memory) or the like has brought a large technological progress to the field of magnetic devices.

A "spin-valve film" is a layered film having a structure of sandwiching a non-magnetic spacer layer between two ferromagnetic layers, and is also referred to as a spin-dependent scattering unit. The magnetization of one (referred to as "pinned layer" or "magnetization fixed layer") of these two ferromagnetic layers is fixed by an antiferromagnetic layer or the like, and the magnetization of the other one (referred to as "free layer" or "magnetization free layer") can be turned according to an external magnetic field. In the spin-valve film, by changing relative angles of the magnetization directions of a pinned layer and a free layer, a giant magneto-resistive change is obtained.

As magnetoresistive effect elements using the spin-valve film, there are CIP (Current In Plane)-GMR element, CPP (Current Perpendicular to Plane)-GMR element, and TMR (Tunneling Magneto Resistance) element. In the CIP-GMR element, the sense current is conducted in parallel to the face of the spin-valve film, and in the CPP-GMR and TMR elements, the sense current is conducted in a direction substantially perpendicular to the face of the spin-valve film. The method of conducting the sense current perpendicularly is gaining more attention as a technology corresponding to future high recording density heads.

Here, in the metal CPP-GMR element in which the spin-valve film is formed of a metal layer, an amount of change in resistance due to magnetization is small, and thus it is difficult to detect a minute magnetic field (for example, a magnetic field in a magnetic disk having high recording density).

As the spacer layer, a CPP element using an oxide layer [NOL (nano-oxide layer)] including current paths in a thickness direction is proposed (refer to JP-A 2002-208744 (KOKAI)). In this element, both element resistance and an MR ratio can be increased by a current-confined-path (CCP) effect. Hereinafter, this element is referred to as CCP-CPP element.

SUMMARY OF THE INVENTION

Here, improvement in sensitivity of a CCP-CPP element is demanded. An example of the sensitivity of a CCP-CPP element is MR ratio. Further, in the CCP-CPP element, a local current density at a portion where current is confined becomes an extremely large value, and thus it is important to realize a film structure capable of assuring good reliability even with a giant current density.

An object of the present invention is to provide a magnetoresistive effect element, a magnetic head, and a magnetic disk apparatus capable of improving the MR ratio and the reliability.

A magnetoresistive effect element according to an aspect of the present invention includes a magnetization fixed layer including a first crystal grain, having a magnetization direction which is fixed substantially in one direction, a spacer layer arranged on the magnetization fixed layer and having an insulating layer and a metal conductor penetrating the insulating layer, and a magnetization free layer including a second crystal grain, arranged on the spacer layer to oppose the metal conductor and having a magnetization direction which changes corresponding to an external magnetic field.

DESCRIPTION OF THE EMBODIMENTS

Hereinafter, embodiments of the present invention will be described with reference to the drawings. Note that in the following embodiments the composition of an alloy is expressed as atomic %.

First Embodiment

Figure 1:
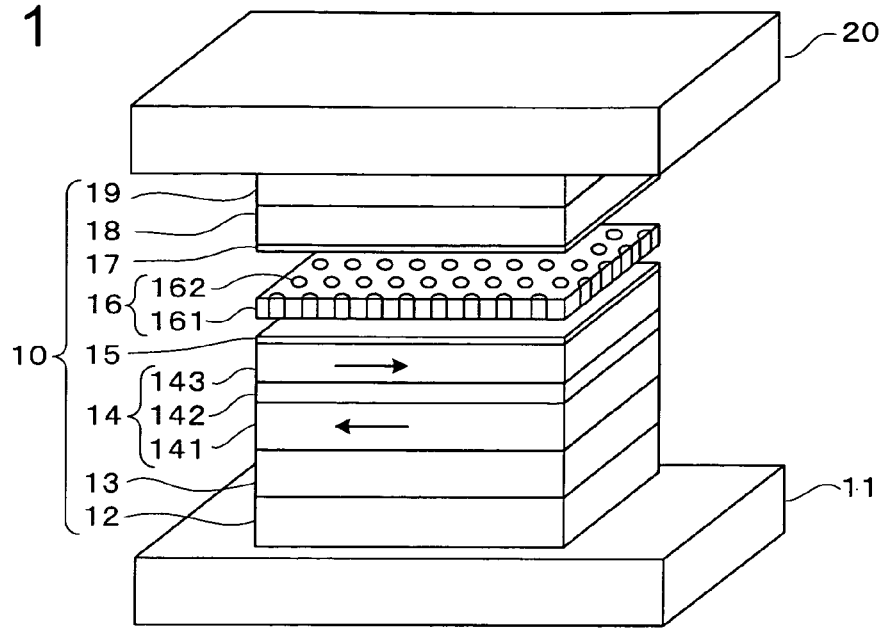
FIG. 1 is a perspective view showing a magnetoresistive effect element according to a first embodiment of the present invention.

FIG. 1 is a perspective view showing a magnetoresistive effect element (CCP-CPP element) according to a first embodiment of the present invention. Note that FIG. 1 and the following drawings are all schematic drawings, in which a ratio between film thicknesses does not always correspond to a ratio between actual film thicknesses.

As shown in this view, the magnetoresistive effect element according to this embodiment has a magnetoresistive effect film 10, and a lower electrode 11 and an upper electrode 20 sandwiching the magnetoresistive effect film 10 from top and bottom, and is formed on a not-shown substrate.

The magnetoresistive effect film 10 is formed by layering a base layer 12, a pinning layer 13, a pinned layer 14, a lower metal layer 15, a spacer layer (CCP-NOL) 16 (an insulating layer 161, current paths 162), an upper metal layer 17, a free layer 18, and a cap layer 19 in order. Among them, the pinned layer 14, the lower metal layer 15, the spacer layer 16, the upper metal layer 17 and the free layer 18 correspond to a spin-valve film formed by sandwiching a non-magnetic spacer between two ferromagnetic layers. Note that for the clarity in appearance, the spacer layer 16 is shown in a state of being separated from the upper and lower layers thereof (the lower metal layer 15 and the upper metal layer 17).

Hereinafter, components of the magnetoresistive effect element will be described.

The lower layer 11 is an electrode for conducting a current in a direction perpendicular to the spin valve film. By applying a voltage across the lower electrode 11 and the upper electrode 20, a current flows inside the spin-valve film along a direction perpendicular to the film face. By means of this current, it becomes possible to sense magnetism by detecting a change in resistance caused by a magnetoresistive effect. As the lower electrode 11, a metal layer having relatively small electrical resistance is used for conducting a current in the magnetoresistive effect element.

The base layer 12 can be divided into a buffer layer 12a and a seed layer 12 for example. The buffer layer 12a is a layer for alleviating roughness on the surface of the lower electrode 11. The seed layer 12b is a layer for controlling the crystal orientation and the crystal grain diameter of the spin-valve film deposited thereon.

As the buffer layer 12a, Ta, Ti, V, W, Zr, Hf, Cr or an alloy thereof can be used. The film thickness of the buffer layer 12a is preferably approximately 1 nm to 10 nm, more preferably approximately 2 nm to 5 nm. If the buffer layer 12a is too thin, it loses its buffer effect. On the other hand, if the buffer layer 12a is too thick, it increases series resistance that does not contribute to an MR ratio. Note that if the seed layer 12b deposited on the buffer layer 12a has a buffer effect, the buffer layer 12a need not be formed necessarily. As a preferable example among the aforementioned ones, Ta [3 nm] can be used.

The seed layer 12b may be of any material as long as it is possible to control the crystal orientation of a layer to be deposited thereon. As the seed layer 12b, a metal layer or the like having an fcc structure (face-centered cubic structure), hcp structure (hexagonal close-packed structure) or bcc structure (body-centered cubic structure) is preferable.

For example, using Ru having the hcp structure or NiFe having the fcc structure as the seed layer 12b, the crystal orientation of the spin-valve film thereabove can be fcc (111) orientation. Further, when the pinning layer 13 is IrMn, good fcc (111) orientation is realized, and when the pinning layer 13 is PtMn, a ordered fct (111) structure (face-centered tetragonal structure) is obtained. Further, when fcc metal is used as a magnetic layer, good fcc (111) orientation is realized, and when bcc metal is used as a magnetic layer, good bcc (110) orientation is made.

In order to exhibit sufficiently a function as the seed layer 12b for improving the crystal orientation, the film thickness of the seed layer 12b is preferably 1 nm to 5 nm, more preferably 1.5 nm to 3 nm. As a preferable example among the above-described ones, Ru [2 nm] can be used.

Crystal orientation properties of the spin-valve film and the pinning layer 13 can be measured by X-ray diffraction. By setting half value widths of rocking curves at an fcc (111) peak of the spin-valve film and an fct (111) peak or a bcc (110) peak of the pinning layer 13 (PtMn) to 3.5 degrees to 6 degrees, favorable crystal orientation properties can be obtained. Note that the dispersion angle of this orientation can also be determined from a diffraction spot using a cross-section TEM.

As the seed layer 12b, instead of Ru, an NiFe-based alloy (for example, $Ni_xFe_{100-x}$ (x=90% to 50%, preferably 75% to 85%) or $(Ni_xFe_{100-x})_{100-y}Z_y$ (Z=Cr, V, Nb, Hf, Zr, Mo) that is NiFe to which a third element Z is added to make it non-magnetic) can also be used. With the NiFe-based seed layer 12b, a favorable crystal orientation property can be obtained relatively easily, and the half value width of a rocking curve measured in the same manner as described above can be 3 to 5 degrees.

The seed layer 12b has not only the function to improve the crystal orientation but also the function to control the crystal grain diameter of the spin-valve film. Specifically, the crystal grain diameter of the spin-valve film can be controlled to 5 nm to 20 nm, and even when the size of the magnetoresistive effect element becomes small, a high MR ratio can be realized without causing dispersion in characteristics.

The crystal grain diameter of the spin-valve film can be determined by the diameter of a crystal grain of a layer arranged between the seed layer 12b and the spacer layer 16 (for example, it can be determined by cross-section TEM or the like). For example, when the pinned layer 14 is a bottom-type spin-valve film located lower than the spacer layer 16, it can be determined by the crystal grain diameter of the pinning layer 13 (antiferromagnetic layer) or the pinned layer 14 (magnetization fixed layer) formed on the seed layer 12b.

For a reproducing head corresponding to high density recording, an element size is definitely a minute size of 100 nm or smaller. A large ratio of the crystal grain diameter to the element size causes dispersion in characteristics of the element, and thus the crystal grain diameter of the spin-valve film being larger than 20 nm is not favorable.

Since the small number of crystal grains per an element area can cause dispersion in characteristics due to the small number of crystals, increasing the crystal grain diameter is not so favorable. Particularly for the CCP-CPP element forming current paths, increasing the crystal grain diameter is not so favorable.

On the other hand, the larger the crystal grain diameter, the smaller the diffusive electron scattering and the inelastic scattering site due to a crystal grain boundary. Accordingly, in order to realize a large MR ratio, it is preferable that the crystal grain diameter is large, and at least 5 nm or larger is necessary.

As above, requirements for the crystal grain diameter in view of MR ratio and in view of reducing the dispersion in each element conflict with each other and are in a trade-off relationship. A preferable range of the crystal grain diameter considering this trade-off relationship is 5 to 20 nm. A detailed designing method regarding the crystal grain diameter will be described in detail later.

In order to obtain the above-described crystal grain diameter of 5 to 20 nm, as the seed layer $12b$, Ru 2 nm or the composition y of the third element Z being approximately 0 to 30% in the case of $(Ni_xFe_{100-x})_{100-y}Z_y$ (Z=Cr, V, Nb, Hf, Zr, Mo) layer (including a case that y being 0%) is preferable.

As described above, the film thickness of the seed layer $12b$ is preferably approximately 1 to 5 nm, more preferably 1.5 to 3 nm. If the seed layer $12b$ is too thin, effects such as controlling the crystal orientation will be lost. On the other hand, if the seed layer $12b$ is too thick, it leads to increase in series resistance, and may further cause irregularity of an interface of the spin-valve film.

Note that any material other than ones described herein may be used for the seed layer $12b$ as long as it is possible to realize a good seed layer $12b$ with a minute crystal grain diameter.

The pinning layer 13 has a function to fix magnetization of a ferromagnetic layer to be the pinned layer 14 deposited thereon by adding unidirectional anisotropy thereto. As the material of the pinning layer 13, antiferromagnetic materials such as PtMn, PdPtMn, IrMn, RuRhMn can be used. Among them, IrMn is advantageous as a material for a head corresponding to high recording density. IrMn can apply unidirectional anisotropy with a thinner film thickness than PtMn, and thus is suitable for reducing a gap which is necessary for high density recording.

In order to add sufficiently strong unidirectional anisotropy, the film thickness of the pinning layer 13 is set appropriately. When the material of the pinning layer 13 is PtMn or PdPtMn, the film thickness thereof is preferably approximately 8 to 20 nm, more preferably 10 to 15 nm. When the material of the pinning layer 13 is IrMn, it is possible to add the unidirectional anisotropy even with a film thickness smaller than PtMn or the like, which is preferably 2 to 18=m, more preferably 4 to 15 nm. As a preferable example among the above-described ones, IrMn [7 nm] can be used.

As the pinning layer 13, instead of the antiferromagnetic layer, a hard magnetic layer can also be used. As the hard magnetic layer, for example, CoPt (Co=50 to 85%), $(Co_xPt_{100-x})_{100-y}Cr_y$(x=50 to 85%, y=0 to 40%), FePt (Pt=40 to 60%) can be used. The hard magnetic layer (CoPt in particular) has relatively smaller specific resistance, and thus is capable of suppressing increase in series resistance and area resistance RA.

As the pinned layer 14, a preferable example is a synthetic pinned layer constituted of a lower pinned layer 141 (for example, $Co_{90}Fe_{10}$ 3.5 nm), a magnetic coupling layer 142 (for example, Ru), and an upper pinned layer 143 (for example, $(Fe_{50}Co_{50}$ [1 nm]/Cu [0.25 nm])×2/$Fe_{50}Co_{50}$ [1 nm]). The pinning layer 13 (for example, IrMn) and the lower pinned layer 141 immediately thereabove are coupled by exchange magnetic coupling so as to have a unidirectional anisotropy. The lower pinned layer 141 and the upper pinned layer 143 above and below the magnetic coupling layer 142 are strongly magnetically coupled so that the directions of magnetization thereof are in antiparallel to each other.

As a material for the lower pinned layer 141, for example, a $Co_xFe_{100-x}$ alloy (x=0 to 100%), $Ni_xFe_{100-x}$ alloy (X=0 to 100%), or one of them to which a non-magnetic element is added can be used. Further, as the material of the lower pinned layer 141, a single element of Co, Fe, Ni or an alloy thereof may be used.

It is preferable that the magnetic film thickness of the lower pinned layer 141 (saturation magnetization Bs×film thickness t (a product of Bs with t) is substantially equal to the magnetic film thickness of the upper pinned layer 143. Specifically, it is preferable that the magnetic film thickness of the upper pinned layer 143 and the magnetic film thickness of the lower pinned layer 141 correspond with each other. As an example, when the upper pinned layer 143 is ($Fe_{50}Co_{50}$ [1 nm]/Cu [0.25 nm])×2/$Fe_{50}Co_{50}$ [1 nm], the saturation magnetization of the FeCo being a thin film is approximately 2.2 T, so that the magnetic film thickness is 2.2 T×3 nm=6.6 Tnm. Since the saturation magnetization of $Co_{90}Fe_{10}$ is approximately 1.8 T, the film thickness t of the lower pinned layer 141 which provides the magnetic film thickness equal to the above is 6.6 Tnm/1.8 T=3.66 nm. Therefore, it is desirable to use $Co_{90}Fe_{10}$ with a film thickness of approximately 3.6 nm.

The film thickness of the magnetic layer used for the lower pinned layer 141 is preferably approximately 2 to 5 nm. It is based on views of unidirectional anisotropy magnetic field intensity by the pinning layer 13 (for example, IrMn) and antiferromagnetic coupling magnetic field intensity of the lower pinned layer 141 and the upper pinned layer 143 via the magnetic coupling layer 142 (for example, Ru). If the lower pinned layer 141 is too thin, the upper pinned layer 143 affecting a MR ratio must be made thin, so that thus the MR ratio becomes small. On the other hand, if the lower pinned layer 141 is too thick, it becomes difficult to obtain a sufficient unidirectional anisotropy magnetic field necessary for operating a device. A preferable example is a $Co_{90}Fe_{10}$ with a film thickness of 3.6 nm.

The magnetic coupling layer 142 (for example, Ru) has a function to form a synthetic pinned layer by generating antiferromagnetic coupling between the upper and lower magnetic layers (lower pinned layer 141 and upper pinned layer 143). The film thickness of an Ru layer as the magnetic coupling layer 142 is preferably 0.8 to 1 nm. Note that any material other than Ru may be used as long as it generates sufficient antiferromagnetic coupling between the upper and lower magnetic layers. Instead of the film thickness 0.8 to 1 nm corresponding to a second peak of RKKY (Ruderman-Kittel-Kasuya-Yosida) coupling, a film thickness 0.3 to 0.6 nm corresponding to a first peak of the RKKY coupling can also be used. Here, Ru of 0.9 nm is presented as an example, by which a stable characteristic of more reliable coupling can be obtained.

As described above, as an example of the upper pinned layer 143, a magnetic layer such as ($Fe_{50}Co_{50}$ [1 nm]/Cu [0.25 nm])×2/$Fe_{50}Co_{50}$ [1 nm] can be used. The upper pinned layer 143 forms part of a spin-dependent scattering unit. The upper pinned layer 143 is a magnetic layer contributing directly to the MR effect, whose constituting material and film thickness are both important for obtaining a large MR ratio. In particular, the magnetic material located at an interface with the spacer layer 16 is important particularly in terms of contribution to spin-dependent interface scattering.

An effect of using $Fe_{50}Co_{50}$ having the bcc structure which is used herein as the upper pinned layer 143 will be described. When a magnetic material having the bcc structure is used as the upper pinned layer 143, it provides a large spin-dependent interface scattering effect, so that a large MR ratio can be realized. Examples of the FeCo-based alloy having the bcc structure include $Fe_xCo_{100-x}$ (X=30 to 100%) and one made by adding an additive element to $Fe_xCo_{100-x}$. Among them, an example of a material that is easy to use is $Fe_{40}Co_{60}$ to $Fe_{80}Co_{20}$ which satisfy all the characteristics.

When the upper pinned layer 143 is formed of a magnetic layer having the bcc structure with which a high MR ratio is easily realized, the total film thickness of this magnetic layer is preferably 1.5 nm or larger. It is for keeping the bcc structure stable. Since a metal material used for the spin valve film is often of the fcc structure or the fct structure, it is possible that only the upper pinned layer 143 has the bcc structure. Therefore, if the film thickness of the upper pinned layer 143 is too thin, it becomes difficult to keep the bcc structure stable, and the high MR ratio cannot be obtained.

Here, as the upper pinned layer 143, $Fe_{50}Co_{50}$ including an ultrathin Cu layer is used. Now, the upper pinned layer 143 is constituted of FeCo with a total film thickness of 3 nm and Cu of 0.25 nm layered on every 1 nm of FeCo, and the total film thickness thereof is 3.5 nm.

A large film thickness of the upper pinned layer 143 makes it easy to obtain a large MR ratio, but for obtaining a large pinned fixed magnetic field a small film thickness is preferable, and therefore a trade-off relationship exists. For example, when using an FeCo alloy layer having the bcc structure, it is necessary to stabilize the bcc structure, and thus the film thickness of 1.5 nm or larger is preferable. Further, also when using a CoFe alloy layer having the fcc structure, a film thickness of 1.5 nm or larger is preferable for obtaining the large MR ratio. On the other hand, in order to obtain the large pinned fixed magnetic field, the film thickness of the upper pinned layer 143 is preferably 5 nm or smaller at the maximum, more preferably 4 nm or smaller.

As above, the film thickness of the upper pinned layer 143 is preferably 1.5 to 5 nm, more preferably approximately 2.0 to 4 nm.

For the upper pinned layer 143, a $Co_{90}Fe_{10}$ alloy having the fcc structure, Co having the hcp structure, and a cobalt alloy which are widely used for conventional magnetoresistive effect elements can be used instead of the magnetic material having the bcc structure. As the upper pinned layer 143, single metals such as Co, Fe, Ni or alloy materials including any one of them can all be used. Magnetic materials for the upper pinned layer 143 are, when arranging in order from the most advantageous one for obtaining a large MR ratio, an FeCo alloy material having the bcc structure, a cobalt alloy with a cobalt composition of 50% or larger, a nickel alloy with an Ni composition of 50% or larger.

Also, as the upper pinned layer 143, it is possible to use Heusler magnetic alloy layer such as $Co_2MnGe$, $Co_2MnSi$, $Co_2MnAl$.

Presented as examples here are ones alternately layering a magnetic layer (FeCo layer) and a non-magnetic layer (ultrathin Cu layer) as the upper pinned layer 143. In the upper pinned layer 143 having such a layered structure with a non-magnetic element material, it is possible to improve by the ultrathin Cu layer a spin-dependent bulk scattering effect, which is called a spin-dependent bulk scattering effect.

The "spin-dependent bulk scattering effect" is used as a term in pair with the spin-dependent interface scattering effect. The spin-dependent bulk scattering effect is a phenomenon that the MR effect is exhibited inside a magnetic layer. The spin-dependent interface scattering effect is a phenomenon that the MR effect is exhibited at the interface between a spacer layer and a magnetic layer.

Hereinafter, improvement in the bulk scattering effect owing to the layered structure of a magnetic layer and a non-magnetic layer will be described.

In the CCP-CPP element, a current is confined in the vicinity of the spacer layer 16, contribution of resistance in the vicinity of an interface of the spacer layer 16 is very large. Specifically, the ratio of the resistance at the interface between the spacer layer 16 and the magnetic layers (pinned layer 14, free layer 18) to the resistance of the entire magnetoresistive effect element is large. This shows that the contribution of the spin-dependent interface scattering effect is very large in the CCP-CPP element and therefore is important. Specifically, selection of the magnetic material located at the interface of the spacer layer 16 has very important meaning as compared to the case of a conventional CPP element. This is the reason for using as the upper pinned layer 143 the FeCo alloy layer having the bcc structure with a large spin-dependent interface scattering effect, which is as described above.

However, use of a material with a large spin-dependent bulk scattering effect cannot be ignored, which is still important for obtaining a higher MR ratio. The film thickness of the ultrathin Cu layer for obtaining the spin-dependent bulk scattering effect is preferably 0.1 to 1 nm, more preferably 0.2 to 0.5 nm. If the film thickness of the Cu layer is too thin, the effect of improving the spin-dependent bulk scattering effect becomes weak. If the film thickness of the Cu layer is too thick, the spin-dependent bulk scattering effect may decrease, and moreover the magnetic coupling of the upper and lower magnetic layers with the non-magnetic Cu layers interposing therebetween becomes weak, thereby making the characteristics of the pinned layer 14 insufficient. Accordingly, for the one presented as a preferable example, Cu of 0.25 nm is used.

For the material of the non-magnetic layer between the magnetic layers, Hf, Zr, Ti or the like may be used instead of Cu. On the other hand, when these ultrathin non-magnetic layers are inserted, the film thickness per one magnetic layer such as FeCo is preferably 0.5 to 2 nm, more preferably approximately 1 to 1.5 nm.

As the upper pinned layer 143, instead of the alternate layered structure of the FeCo layer and the Cu layer, a layer made by alloying FeCo and Cu may be used. An example of such an FeCoCu alloy is $(Fe_xCo_{100-x})_{100-y}Cu_y$ (x=30 to 100%, y=3 to 15% approximately), but another composition range may be used. Here, as an element to be added to FeCo, another element such as Hf, Zr, Ti may be used instead of Cu.

For the upper pinned layer 143, a single layer film constituted of Co, Fe, Ni or an alloy material thereof may be used. For example, as the upper pinned layer 143 with the simplest structure, a $Co_{90}Fe_{10}$ single layer of 2 to 4 nm which has been used widely may be used. To this material, another element may be added.

The lower metal layer 15 is used for forming the current paths 162, and is a supply source for the current paths 162. The lower metal layer 15 also has a function as a stopper layer to suppress oxidation of the upper pinned layer 143 located therebelow when the insulating layer 161 located thereabove is formed.

When the constituting material of the current paths 162 is Cu, it is preferable that the constituting material of the lower metal layer 15 is the same (Cu). When the constituting material of the current paths 162 is a magnetic material, this magnetic material may either be the same as or different from the magnetic material of the pinned layer 14. As the constituting material of the current paths 162, Au, Ag may be used other than Cu.

The spacer layer (CCP-NOL) 16 has the insulating layer 161 and the current paths 162.

The insulating layer 161 is constituted of oxide, nitride, oxynitride, or the like. As the insulating layer 161, an amorphous structure such as $Al_2O_3$ and a crystal structure such as MgO are both possible. In order to exhibit the function as a spacer layer, the thickness of the insulating layer 161 is preferably in the range of 1 to 3 nm, more preferably 1.5 to 2.5 nm.

As typical insulating materials used for the insulating layer 161, there are ones adopting $Al_2O_3$ as the base material and ones having $Al_2O_3$ to which an additive element is added. As the additive element, there are Ti, Hf, Mg, Zr, V, Mo, Si, Cr, Nb, Ta, W, B, C, V, and the like. An amount of adding these additive elements can be changed appropriately in the range of approximately 0 to 50%. As an example, $Al_2O_3$ of approximately 2 nm can be used as the insulating layer 161.

For the insulating layer 161, Ti oxide, Hf oxide, Mg oxide, Zr oxide, Cr oxide, Ta oxide, Nb oxide, Mo oxide, Si oxide, V oxide can be used instead of the Al oxide such as $Al_2O_3$. Also in the case of these oxides, the above materials can be used as additive elements. Further, the amount of additive element can be changed appropriately in the range of approximately 0 to 50%.

Instead of these oxides, an oxinitride or a nitride based on Al, Si, Hf, Ti, Mg, Zr, V, Mo, Nb, Ta, W, B, C as described above can be used as long as it is a material having a function to insulate against an electric current.

The current paths 162 are paths (routes) for passing a current perpendicularly to a film face of the spacer layer 16, and for confining a current. They function as a conductor to allow passage of a current in a direction perpendicular to a film face of the insulating layer 161, and are constituted of a metal layer of Cu or the like for example. Specifically, the spacer layer 16 has a current-confined path structure (CCP structure), and an MR ratio thereof can be increased by the current-confined-path effect. Other than Cu, examples of materials for forming the current paths 162 (CCP), include Au, Ag, Ni, Co, Fe, and an alloy layer including at least one of these elements. As an example, the current paths 162 can be formed of an alloy layer including Cu. An alloy layer such as CuNi, CuCo, CuFe can also be used. Here, a composition of having 50% or more of Cu is preferable for a high MR ratio and to reduce an interlayer coupling field (Hin) between the pinned layer 14 and the free layer 18.

The current paths 162 are regions having significantly smaller contents of oxygen and nitrogen (there is a difference of at least double or more in contents of oxygen and nitrogen) as compared to the insulating layer 161, and are in a crystal phase. The crystal phase has lower resistance than an amorphous phase, and easily functions as the current paths 162.

The upper metal layer 17 functions as a barrier layer for suppressing diffusion of oxygen/nitrogen constituting the spacer layer 16 into the free layer 18 and as a seed layer for facilitating favorable crystal growth in the free layer 18.

Specifically, the upper metal layer 17 protects the free layer 18 deposited thereon from contacting the oxide/nitride/oxynitride in the spacer layer 16 and being oxidized or nitrided. Specifically, the upper metal layer 17 restricts direct contact of oxygen in the oxide layer of the current paths 162 with the free layer 18.

Further, the upper metal layer 17 has a function to make the crystallinity of the free layer 18 favorable. For example, when the material of the insulating layer 161 is amorphous (for example, $Al_2O_3$), the crystallinity of the metal layer deposited thereon becomes poor, but by arranging an ultrathin seed layer (for example, a Cu layer) which makes crystallinity favorable, the crystallinity of the free layer 18 can be improved significantly.

The material of the upper metal layer 17 is preferably the same as the material (for example, Cu) of the current paths 162 of the spacer layer 16. This is because if the material of the upper metal layer 17 is different from the material of the current paths 162, it leads to increase in interface resistance, but if the both are the same materials, the increase in interface resistance does not occur.

Note that if a magnetic material is adopted as the constituting material of the current paths 162, this magnetic material may be the same as or different from the magnetic material of the free layer 18.

Other than Cu, as the constituting material of the upper metal layer 17, Au, Ag or the like can be used.

The free layer 18 is a layer having a ferromagnetic material which changes its magnetization direction by an external magnetic field. An example of the free layer 18 is a two-layer structure, $Co_{90}Fe_{10}$ [1 nm]/$Ni_{83}Fe_{17}$ [3.5 nm] using NiFe with CoFe being inserted in an interface. In this case, at the interface with the spacer layer 16, provision of a CoFe alloy rather than an NiFe alloy is preferable for realizing a large MR ratio. To obtain a high MR ratio, selection of the magnetic material of the free layer 18 located at the interface of the spacer layer 16 is important. Note that if the NiFe layer is not used, a single layer of $Co_{90}Fe_{10}$ [4 nm] can be used. Further, a free layer 18 constituted of three layer structure such as CoFe/NiFe/CoFe may be used. Further, as will be described later, an amorphous alloy layer such as CoZrNb may be used as a part of the free layer 18.

Among CoFe alloys, $Co_{90}Fe_{10}$ is preferable because it has a stable soft magnetic characteristic. When using a CoFe alloy close to $Co_{90}Fe_{10}$, a film thickness thereof is preferably set to 0.5 to 4 nm. Besides that, $Co_xFe_{100-x}$ (x=70 to 90) is also a preferable usable composition range.

Further, as the free layer 18, one made by alternately layering plural CoFe layers or Fe layers of 1 to 2 nm and plural ultrathin Cu layers of approximately 0.1 to 0.8 nm may be used.

Among the materials forming the spacer layer 16, when the current paths 162 in which a current flows is formed of a Cu layer, use of an FeCo layer of bcc as an interface material with the spacer layer 16 also in the free layer 18 similarly to the pinned layer 14 increases the MR ratio. As the interface material with the spacer layer 16, instead of the CoFe alloy of fcc, an FeCo alloy of bcc can also be used. In this case, $Fe_xCo_{100-x}$ (x=30 to 100), by which a bcc layer is easily formed, or a material made by adding an additive element thereto can be used. For example, $Co_{50}Fe_{50}$ [1 nm]/$Ni_{85}Fe_{15}$ [3.5 nm] can be used.

Further, as a part of the free layer 18, an amorphous magnetic layer of CoZrNb or the like may be used.

However, when using the amorphous magnetic layer, it is necessary to use a magnetic layer having a crystal structure for an interface in contact with the spacer layer 16 which affects the MR ratio largely. As the structure of the free layer 18, the following structure is possible viewing from the spacer layer 16 side. Specifically, as the structure of the free layer 18, (1) only a crystal layer, (2) layers of crystal layer/amorphous layer, (3) layers of crystal layer/amorphous layer/crystal layer, and the like can be considered. What is important here is that a crystal layer always contacts the interface with the spacer layer 16 in any one of (1) to (3).

Here, when forming the free layer 18, crystal growth treatment is carried out in a stage that apart or whole of the magnetic layer is formed. This crystal growth treatment is for controlling the crystal growth or the crystal grain diameter of the magnetic layer thereof, and details thereof will be described later.

The cap layer 19 has a function to protect the spin-valve film. The cap layer 19 can be, for example, a plurality of metal layers, for example, a two-layer structure of a Cu layer and an Ru layer (Cu [1 nm]/Ru [10 nm]). Further, as the cap layer 19, an Ru/Cu layer in which Ru is arranged on the free layer 18 side can also be used. In this case, the film thickness of Ru is preferably approximately 0.5 to 2 nm. The cap layer 19 of this structure is desirable especially when the free layer 18 is constituted of NiFe. This is because it can reduce magnetostriction in an interface mixing layer formed between the free layer 18 and the cap layer 19 since Ru is in insoluble relationship with Ni.

When the cap layer 19 is either of Cu/Ru or Ru/Cu, the film thickness of the Cu layer is preferably approximately 0.5 to 10 nm, and the film thickness of the Ru layer can be approximately 0.5 to 5 nm. Since Ru has a high specific resistance value, use of a too thick Ru layer is not favorable, and therefore it is preferable to be in such a film thickness range.

As the cap layer 19, a metal layer other than the Cu layer or Ru layer may be provided. The structure of the cap layer 19 is not limited particularly, and another material may be used as long as it can protect as a cap the spin-valve film. However, selection of a cap layer may change the MR ratio or the long-term reliability, and therefore care must be taken. Also in these views, Cu and Ru are desirable examples of a material for a cap layer.

The upper electrode 20 is an electrode for conducting a current in a direction perpendicular to the spin-valve film. By applying a voltage across the lower electrode layer 11 and the upper electrode layer 20, a current flows inside the spin-valve film in a direction perpendicular to this film. For the upper electrode 20, a material with low electrical resistance (for example, Cu, Au) is used.

(A Minute Structure in the Vicinity of a Current Path 162)

In the CCP-CPP spin-valve film, characteristics (for example, magnetic field sensitivity (MR ratio), and reliability at a high-temperature and a high-voltage) of the element is dependent on a microstructure in the vicinity of a current path 162. Specifically, so as to ensure the characteristics of the element, it is very important to control the microstructure.

Figure 2:
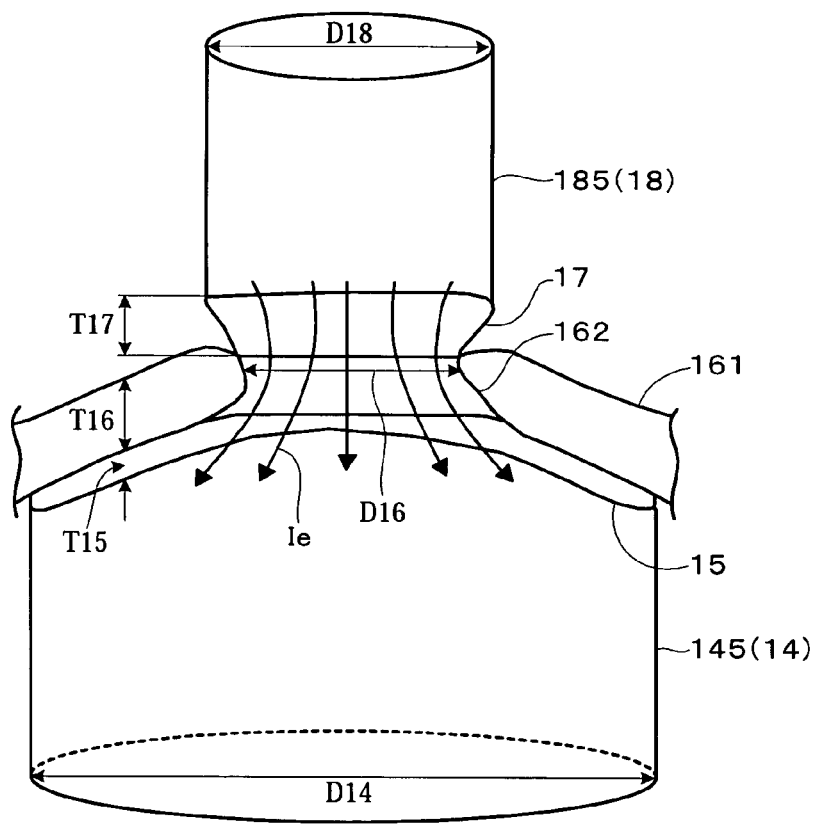
FIG. 2 is an enlarged view showing in enlargement the vicinity of a spacer layer, a current path in particular of FIG. 1.

FIG. 2 is an enlarged view showing in enlargement the vicinity of a spacer layer 16, particularly a current path 162.

As shown in this view, a pinned layer 14 (crystal grain 145), a lower metal layer 15, a current path 162, an upper metal layer 17, and a free layer 18 (crystal grain 185) are arranged vertically to correspond with each other. The pinned layer 14 and the free layer 18 are constituted of plural crystal grains 145, 185 respectively. Here, only crystal grains 145, 185 in the vicinity of the current path 162 are shown.

When part of the free layer 18 includes an amorphous layer, it is necessary that at least the vicinity of an interface with the spacer layer 16 has the crystal structure as shown in FIG. 2. When an amorphous layer is included in part of the free layer 18, a magnetic amorphous layer is layered on the crystal grain 145 in FIG. 2.

As shown in this view, the CCP-CPP spin-valve film according to this embodiment has structural characteristics as follows.

(1) The crystal grain 145 of the pinned layer 14 is arranged opposing the current path 162.

(2) The crystal grain 185 of the free layer 18 is arranged opposing the current path 162. Incidentally, one aspect of "opposing" is a case that the current path 162 is arranged immediately under at least either of the crystal grain 145 or 185.

(3) It is preferable that the grain diameter D18 of the crystal grain 185 of the free layer 18 is smaller than the grain diameter D14 of the crystal grain 145 of the pinned layer 14.

(4) Appropriate ranges of the grain diameters D14, D18 of crystal grains 145, 185

The range of the grain diameter D14 of the crystal grain 145 of the pinned layer 14 is preferably 5 to 20 nm, more preferably 8 to 20 nm.

The range of the grain diameter of the crystal grain 185 of the free layer 18 is preferably 3 nm to 10 nm, more preferably 3 nm to 8 nm.

A combination of the crystal grain diameter 185 of the free layer 18 being 3 to 8 nm and the crystal grain diameter 145 of the pinned layer 14 being 8 to 20 nm is preferable.

(5) It is preferable that the film thickness T17 of the upper metal layer 17 is larger than the film thickness T15 of the lower metal layer 15.

(6) Appropriate ranges of the film thicknesses T15, T17 of the lower metal layer 15 and the upper metal layer 17

When the constituting material of the lower metal layer 15 is different from the constituting material of the pinned layer 14, the range of the film thickness T15 of the lower metal layer 15 is preferably 0.1 to 1.0 nm, more preferably 0.1 to 0.5 nm.

When the constituting material of the upper metal layer 17 is different from the constituting material of the free layer 18, the range of the film thickness T17 of the upper metal layer 17 is preferably 0.2 to 1.5 nm, more preferably 0.3 to 1.0 nm.

(7) The film thickness T16 of the insulating layer 161 is, for example, preferably approximately 1 to 3 nm, more preferably 1.5 to 2.5 nm. The diameter D16 of a current path 162 is, for example, approximately 2 to 6 nm.

Hereinafter, the above-described structure will be described in detail (1) Opposing the current path 162, there are arranged the crystal grains 145, 185 of the pinned layer 14 and the free layer 18 respectively. Here, center portions of the crystal grains 145, 185 are arranged so that crystal grain boundaries 146, 186 are not located immediately above or below the current path 162.

A current is confined in the current path 162 and flows into the magnetic layers (both the pinned layer 14 and the free layer 18), thereby realizing improvement in the MR ratio. Here, reduction of diffusive electron scattering in the magnetic layer is necessary for realizing a high MR ratio. For this purpose, in addition to making the crystallinity of the magnetic layer good (having less crystal defect), the positional relationship between the crystal grain boundaries of crystal grains 145, 185 and the current path 162 is important. When the crystal grain boundary 146 exists immediately above or below the current path 162, conducted electrons confined in the current path 162 are scattered at the crystal grain boundary of the magnetic layer, thereby losing spin information, or shortening an average free stroke. This means decrease in the MR ratio.

Moreover, since a crystal grain boundary is a region in which crystallinity is incomplete, deterioration in reliability easily occurs due to electromigration when a current with large current density confined in the current path 162 flows into the crystal grain boundaries. It is important also in view of reliability that no crystal grain boundary with incomplete crystallinity exists immediately above the current path 162 where current density becomes large.

Since the current path 162 is arranged at the center portion of the crystal grain 145 of the pinned layer 14, a sense current that has passed through the current path 162 flows the center portion of the crystal grain 145 of the pinned layer 14. Accordingly, electrons flowing from the current path 162 (or flowing to the current path 162) flow through a region with good crystallinity, thereby reducing scattering of conducted electrons (inelastic scattering) or spin flipping of conducted electrons in the crystal grain boundary. As a result, the MR ratio increases. In this manner, in order to reduce unnecessary inelastic scattering, it is important that the crystal grain boundary of the free layer 18 is not arranged immediately above the current path 162.

Also in the case of the pinned layer 14, in view of reliability, it is important that the crystal grain boundary thereof does not exist immediately under the current path 162.

Here, reference symbol Ie in FIG. 2 shows the flow of electrons, and thus the direction thereof is the reverse of the direction of the sense current (the same applies to later-described FIG. 3 and FIG. 4). Specifically, the electrons flow from the free layer 18 to the pinned layer 14, and the current flows from the pinned layer 14 to the free layer 18.

Such an arrangement relationship between the current path 162 and the crystal grain of a magnetic layer is more severe in the free layer 18 than in the pinned layer 14. As will be described later, the grain diameter of the crystal grain 185 of the free layer 18 is smaller than the grain diameter of the crystal grains 145 of the pinned layer 14. Accordingly, the crystal grain boundary of the free layer 18 exists more frequently in a two-dimensional plane of the film face, and hence it is easily affected by the diffusive electron scattering (inelastic scattering) due to the crystal grain boundary. Specifically, it is needed to take notice more of arrangement of the crystal grain boundary, in other words, it is important that the current path 162 is arranged at the center of the crystal grain of the free layer 18. Specifically, when the diameter D18 of the crystal grain 185 of the free layer 18 is expressed by a relative value from 0 to 100, (method of defining 0 and 100 will be described later), it is important that at least a part of the current path 162 is formed immediately below inside the range of 30 to 70.

(2) The grain diameter D18 of the crystal grain 185 of the free layer 18 is smaller than the grain diameter D14 of the crystal grain 145 of the pinned layer 14.

The interface between the current path 162 and the free layer 18 and the interface between the current path 162 and the pinned layer 14 are important factors for the MR ratio of the CPP. The latter is more important in view of the MR ratio. Specifically, it is preferable to design the microstructure of the crystal grain 145 of the pinned layer 14 in view of increasing the MR ratio. In order to realize a large MR ratio, the crystal grain diameter is preferred to be as large as possible.

In the material of the free layer 18, since a viewpoint of magnetism is large, constraint conditions for a material that can be used for the interface with the current path 162 are large. On the other hand, for the material of the pinned layer 14, there are more options of materials than for the free layer 18. In other words, as a material of the pinned layer 14, it is possible to use a material which increases the spin dependent interface scattering effect only in the interface with the current path 162.

Since a current is not confined in the magnetic layer, the current in the magnetic layer spreads as the distance in a film thickness direction from the spacer layer 16 gets longer. Therefore, in order to realize the high MR ratio, it is preferable that the crystal grain boundaries 146, 186 are absent not only immediately above and below the current path 162 but also in the vicinity of the current path 162. Accordingly, in order to realize the large MR ratio, it is preferable that the grain diameters D14, D18 of the crystal grains 145, 185 of the magnetic layers are made larger so that the crystal grain boundaries are not arranged in the vicinity of the current path 162. Further, in order to increase magnetization fixing ability of the pinned layer 14 sufficiently, it is not preferable to make a minute crystal grain, but is preferable to make an appropriately large crystal grain diameter.

However, not only the MR ratio is important as performance of the element (or a magnetic head). Therefore, by enlargement of the crystal grain 145, it is possible that performance of the element decreases.

Since a current path 162 is arranged corresponding to each one of crystal grains 145 of the pinned layer 14, enlargement of the crystal grains 145 decreases the number of current paths 162 per unit element area. For example, when the element size of a CCP-CPP-GMR head is 50×50 nm, assuming that the grain diameter D14 of the crystal grain 145 being 40 nm (the crystal grain diameter is defined by the diameter of a crystal grain inside a film face. If it is not a perfect circle, the largest value of the diameter is taken), the number of crystal grains 145 in one element becomes one or two. This dispersion in number causes dispersion in resistance or MR ratio in each element. In order to reduce the dispersion in each element, it is preferable that the grain diameter of the crystal grain 145 is small. Thus, reduction in dispersion of characteristics in each element and a demand to increase the MR ratio are contradicting requirement specifications.

On the other hand, in the free layer 18, realizing favorable soft magnetism (magnetism that reacts favorably with respect to an external magnetic field) is also important. For realizing the favorable soft magnetism, it is preferable that the crystal grain diameter D18 of the crystal grain 185 is smaller as compared to the element size.

In view of soft magnetism, the free layer 18 can be of an amorphous structure having no crystal grain 185 as the minimum in the case that the grain diameter D18 of the crystal grain 185 is small.

However, for keeping the MR ratio favorable, it is not preferable that the entire free layer 18 is the amorphous structure because it receives inelastic electron scattering in the vicinity of the current path 162. Specifically, for realizing the high MR ratio, it is necessary that the magnetic material in contact with the current path 162 is of a crystal structure which is less affected by the inelastic electron scattering and is capable of realizing low resistance.

When using a magnetic layer having the amorphous structure that can be considered as the minimum state of a minute crystal grain in the vicinity of the current path 162, this magnetic layer cannot be arranged at the interface with the spacer layer 16. In this case, the amorphous magnetic layer is arranged on the spacer layer 16 via a magnetic structure having a crystal structure. Thus, it is important that the magnetic layer having the crystal structure exists at least in the vicinity of the interface on the spacer layer 16 side of the free layer 18.

As above, complex trade-off conditions exist for the crystal grain diameter of the magnetic layer. Specifically, in view of the MR ratio, it is preferable that the crystal grain diameter of the magnetic layer is large. On the other hand, in order to exhibit the magnetization fixing ability of the pinned layer 14, it is preferable that the grain diameter D14 of the crystal grain 145 of the pinned layer 14 is of an appropriate size. Further, in order to eliminate dispersion in the number of current paths 162 and the size thereof, it is preferable that the grain diameter D14 of the crystal grain 145 of the pinned layer 14 to be the base of the current path 162 is small. On the other hand, for making the soft magnetism of the free layer 18 favorable, it is preferable that the grain diameter D18 of the crystal grain 185 of the free layer 18 is small. However, a too small crystal grain diameter D18 leads to decrease in the MR ratio.

(3) Appropriate ranges of the grain diameters D14, D18 of the crystal grains 145, 185 of the pinned layer 14 and the free layer 18 will be described.

A preferable range of the grain diameter D14 of the crystal grain 145 is 5 to 20 nm. When the grain diameter D14 is smaller than this range, the effect of inelastic scattering of electrons due to the crystal grain boundary becomes large, thereby leading to decrease in the MR ratio. On the other hand, for example, if the size of the crystal grain 145 is too large with respect to the element size of 60×60 nm, it causes dispersion in resistance RA or in MR ratio originated in the crystal grain 145. Note that this crystal grain range also matches conditions for keeping the magnetism characteristics of the pinned layer 14 favorable.

A more preferable range of the crystal grain diameter D14 of the crystal grain 145 is 8 to 20 nm.

The grain diameter of the crystal grain 185 of the free layer 18 is preferably 3 to 10 nm, more preferably 3 to 8 nm. This is the range with which a balance between the soft magnetism and the MR ratio can be realized. In view of soft magnetism, it is preferable that the crystal grain diameter is small, but when the crystal grain diameter is too small, it leads to decrease in the MR ratio. In view of the MR ratio, the crystal grain diameter is preferred to be larger than this film thickness range. In view of realizing favorable soft magnetism which makes important contribution to the output of a magnetic head, the above range of the crystal grain diameter is preferable.

As already described, in the free layer 18, as the minimum in the case that the grain diameter D18 is small, a part of the free layer 18 may be an amorphous structure (in view of the soft magnetism). However, as described above, at least immediately above the current path 162, it is preferable to have the crystal grain diameter shown here (in view of realizing the high MR ratio).

(4) The film thickness T15 of the lower metal layer 15 will be described.

When the constituting material of the lower metal layer 15 is different from the constituting material of the pinned layer 14, the film thickness T15 of the lower metal layer 15 is preferably 0.1 to 1.0 nm, more preferably 0.1 to 0.5 nm.

Figure 3:
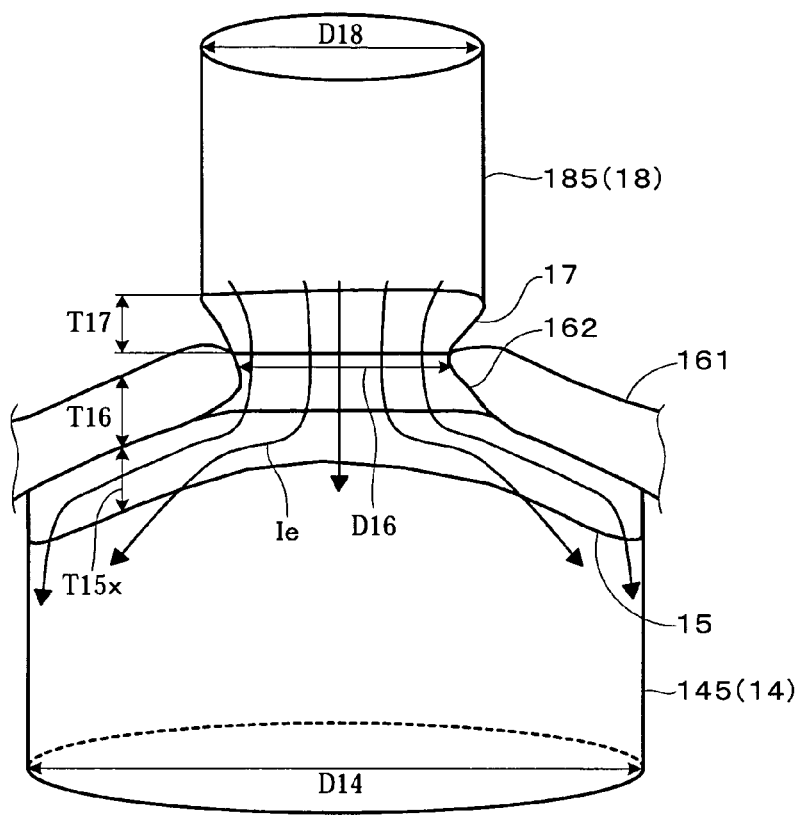
FIG. 3 is a cross-sectional view showing a first comparative example of the present invention.

FIG. 3 is a cross-sectional view showing a first comparative example of the present invention and corresponds to FIG. 2. In this example, the film thickness T15x of the lower metal film 15 is thicker than 1.0 nm.

In order to obtain a high MR ratio in the CCP-CPP element, it is necessary that a current confined in the spacer layer 16 reaches the magnetic layer (pinned layer 14 or free layer 18) while it remains confined. When the lower metal layer 15 is thick, a current confined in the current path 162 spreads inside the lower metal layer 15 with low resistance before reaching the magnetic layer. Accordingly, the effect of increasing the MR ratio caused by the current-confined-path structure in the current path 162 decreases, which leads to decrease in the MR ratio. To avoid this problem, it is desirable that the film thickness T15 of the lower metal layer 15 is 1 nm or smaller.

On the other hand, existence of a layer such as Cu even in a half-atomic layer can avoid direct contact of the pinned layer 14 with the insulating layer 161, and stability as a metal material of the pinned layer 14 can be assured. Therefore, it is preferable that the lower metal layer 15 of 0.1 nm or larger exists. However, when constituting materials of the lower metal layer 15 and the pinned layer 14 are the same, the film thickness T15 of the lower metal layer 15 will not be defined, and thus it is not limited to this.

(5) The film thickness T17 of the upper metal layer 17 will be described.

When the constituting material of the upper metal layer 17 is formed of Cu or the like, in other words, is different from the magnetic material constituting the free layer 18, it is preferable that the film thickness T17 of the upper metal layer 17 is 0.2 to 1.5 nm, more preferably 0.3 to 1.0 nm.

Figure 4:
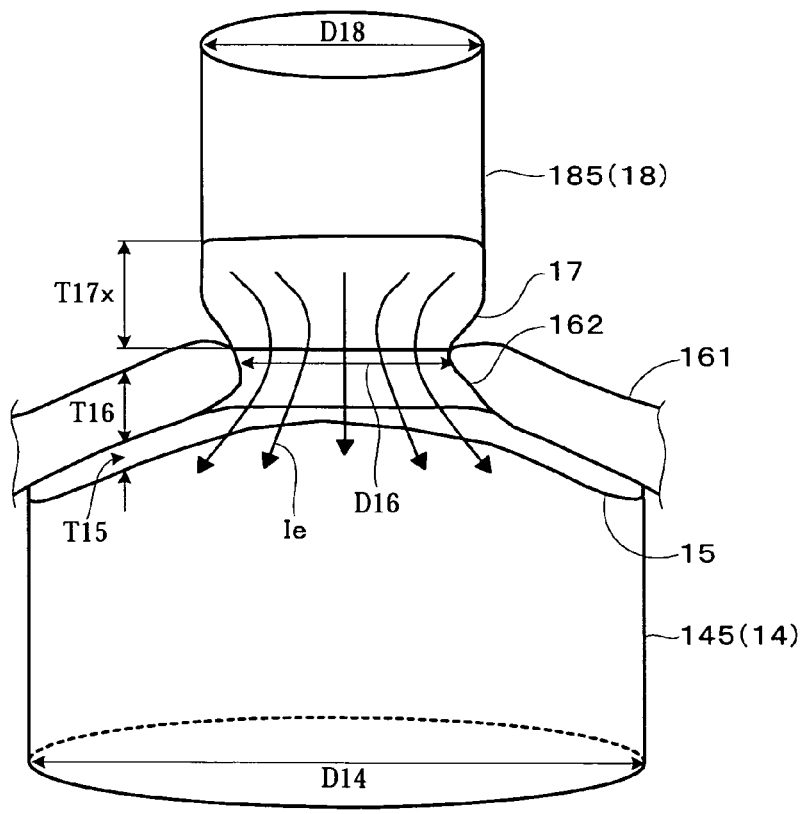
FIG. 4 is a cross-sectional view showing a second comparative example of the present invention.

FIG. 4 is a cross-sectional view showing a second comparative example of the present invention and corresponds to FIG. 2. In this example, the film thickness T17x of the upper metal layer 17 is thicker than 1.5 nm.

When the upper metal layer 17 is thick, a current confined in the current path 162 spreads inside the upper metal layer 17 with low resistance before reaching the magnetic layer. Accordingly, the effect of increasing the MR ratio caused by the current-confined path in the current path 162 decreases, which leads to decrease in the MR ratio. To avoid this problem, it is desirable that the film thickness T17 of the upper metal layer 17 is 1.5 nm or smaller.

On the other hand, when the film thickness T17 of the upper metal layer 17 is thinner than 0.2 nm, it becomes difficult to make the crystallinity of the free layer 18 growing as crystals thereon favorable. Therefore, it is preferable that the film thickness T17 of the upper metal layer 17 is 0.2 nm or larger. However, when constituting materials of the upper metal layer 17 and the free layer 18 are the same, the film thickness of the upper metal layer 17 will not be defined, and thus it is not limited to this.

(6) It is preferable that the film thickness T17 of the upper metal layer 17 is larger than the film thickness T15 of the lower metal layer 15.

When the grain diameter D18 of the crystal grain 185 of the free layer 18 is small, the influence of spread of a current in the metal layer with low resistance above or below the current path 162 is small. Since resistance is large in a crystal grain boundary, the influence of spread of a current in a two-dimensional plane direction is small. Accordingly, it is possible to make the film thickness T17 of the upper metal layer 17 in contact with the magnetic material with a small crystal grain diameter larger than the film thickness T15 of the lower metal layer 15 in contact with the magnetic material with a large crystal grain diameter. For example, when the film thickness T15 of the lower metal layer 15 is 0.2 nm, the film thickness T17 of the upper metal layer 17 can be 0.3 nm or larger.

Further, in view as a seed layer to enhance the crystal growth in the free layer 18, it is preferable that the upper metal layer 17 is thick. Characteristics of the free layer 18 affect the dynamic performance of the element. Therefore, by the upper metal layer 17, the crystallinity of the free layer 18 can be improved and the total performance of the element can be improved.

As above, the film thickness T17 of the upper metal layer 17 is allowed to be slightly larger than the film thickness T15 of the lower metal layer 15. This corresponds to that the crystal grain diameter of the free layer 18 corresponding to the upper metal layer 17 is smaller than the crystal grain diameter of the pinned layer 14 corresponding to the lower metal layer 15.

(7) The film thickness T16 of the insulating layer 161 and the diameter D16 of the current path 162 will be described.

When the film thickness T16 of the insulating layer 161 is in the range of approximately 1.0 to 3.0 nm (more preferably, 1.5 to 2.5 nm), a later-described PIT can be used to easily produce the insulating layer 161 and the current path 162.

Further, the film thickness T16 in this range is advantageous also in terms of the current-confined-path effect.

The diameter of the current path 162 penetrating the insulating layer 161 is 1 nm or larger and 10 nm or smaller, preferably approximately 2 to 6 nm. The current path 162 larger than the diameter 10 nm is not preferable because it causes dispersion in characteristics in each element when its element size is made small, and it is more preferable that a current path 162 larger than a diameter 6 nm does not exist.

Figure 5:
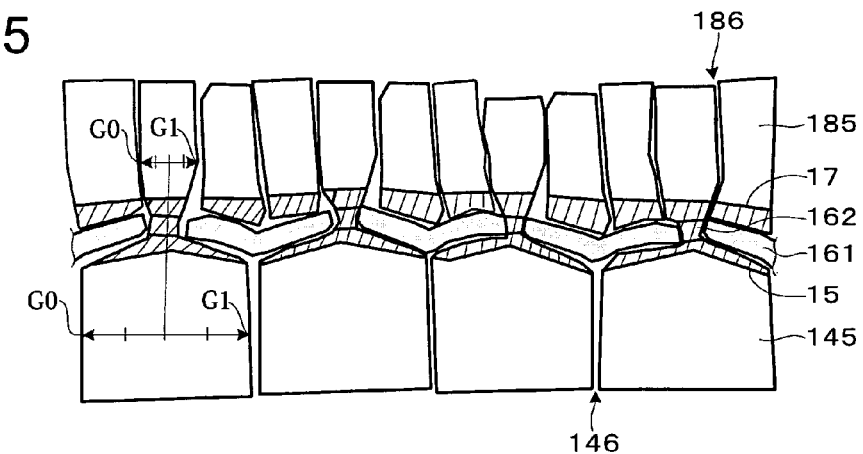
FIG. 5 is a cross-sectional view showing a cross-section of an example of a spacer layer.
Figure 6:
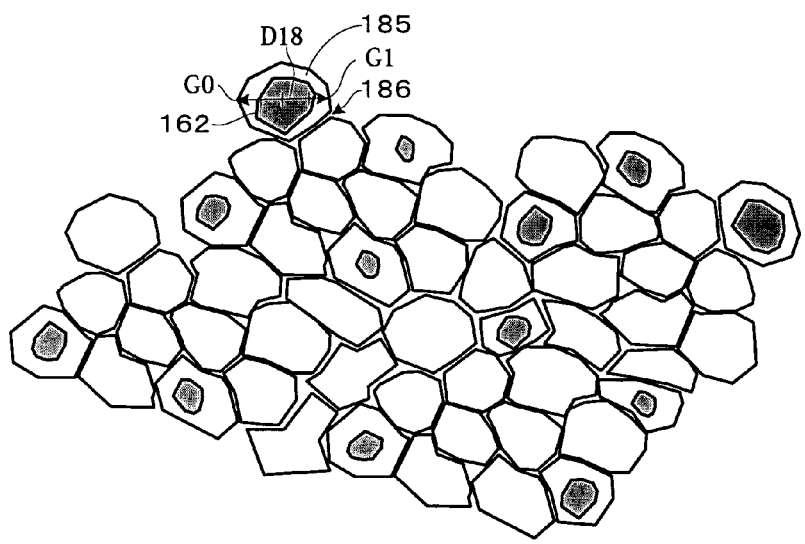
FIG. 6 is a top view showing a top face of the example of the spacer layer.
Figure 7:
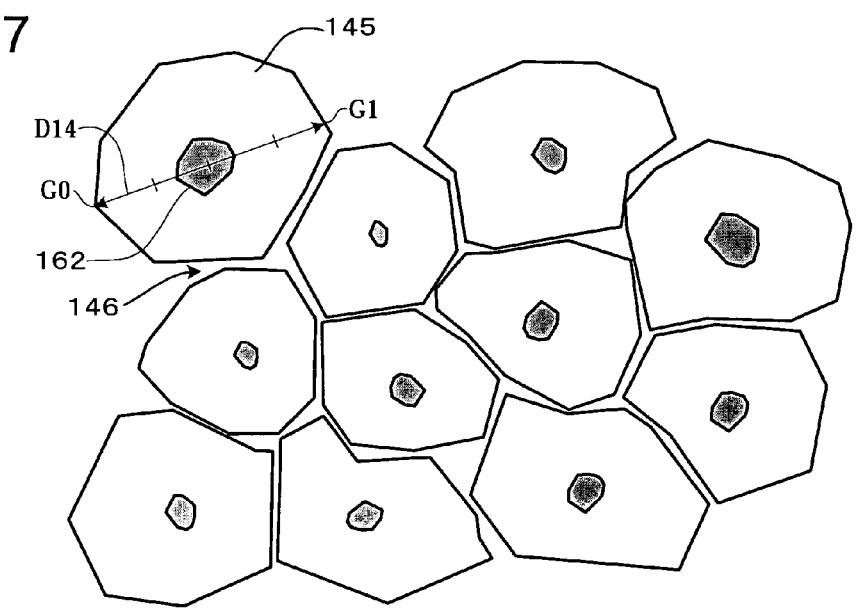
FIG. 7 is a bottom view showing a bottom face of the example of the spacer layer.

FIG. 5, FIG. 6, FIG. 7 are cross-sectional view, top view, and bottom view showing a cross-section, a top face, a bottom face of an example of the spacer layer 16 respectively. The top face and the bottom face show states seen from the free layer 18 side and the pinned layer 14 side, respectively. Note that in these views the magnification ratio is lower as compared to FIG. 2.

FIG. 6 and FIG. 7 show not only crystal grains 185, 145 of the free layer 18 and the pinned layer 14, but also current paths 162 by projection in order to show a vertical positional relationship. Such a microstructure can be confirmed by a later-described three-dimensional atom probe.

As shown in FIG. 5 to FIG. 7, the current paths 162 are arranged on extended lines in a film thickness direction from center portions of the crystal grains 145, 185 of the pinned layer 14 and the free layer 18. This positional relationship can be confirmed by observing the projected structure.

As can be seen from FIG. 5 to FIG. 7, between crystal grains located above the current paths 162, crystal grains 185 of the free layer 18 are also arranged. The crystal grains 185 immediately above the current paths 162 are formed by crystal growth with the current paths 162 being origins, so that the crystallinity thereof is relatively favorable. However, it is also important to make the crystallinity of the crystal grains 185 above the insulating layer 161 (oxide material) favorable other than immediately above the current paths 162 in view of realizing favorable soft magnetism in the free layer 18. This is because conducted electrons confined in a current path 162 flows not only to a single crystal grain 185 of the free layer 18 but also to a neighbor crystal grain 185 via a crystal grain boundary 186.

As above, the crystallinity of a crystal grain 185 adjacent to a crystal grain 185 immediately above a current path 162 is also important. Further, the soft magnetism characteristic of the free layer 18 is decided not only by crystal grains 185 immediately above current paths 162, but the characteristic is decided also including crystal grains 185 other than those immediately above the current paths 162. Specifically, in view of soft magnetism, it is decided to reflect characteristics of all the crystal grains 185, and thus it is important to control microstructures of crystal grains 185 of all magnetic layers.

The crystallinity of the crystal grains 185 other than the crystal grains immediately above the current paths 162 depends not only on a forming process of the current paths 162 but also on a forming process of the free layer 18. By later-described crystal growth treatment, the crystallinity of the crystal grains 185 other than the crystal grains 185 immediately above the current paths 162 can be improved.

Figure 8:
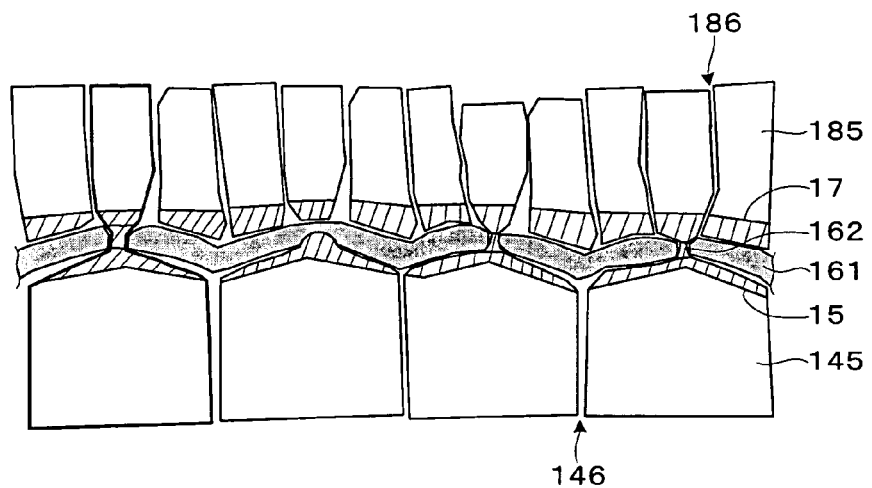
FIG. 8 is a cross-sectional view showing a cross-section of another example of a spacer layer.
Figure 9:
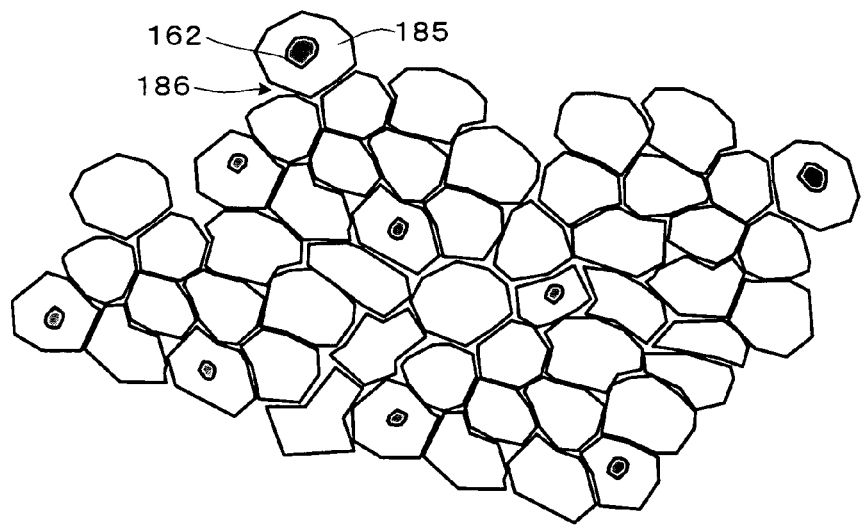
FIG. 9 is a top view showing a top face of another example of the spacer layer.
Figure 10:
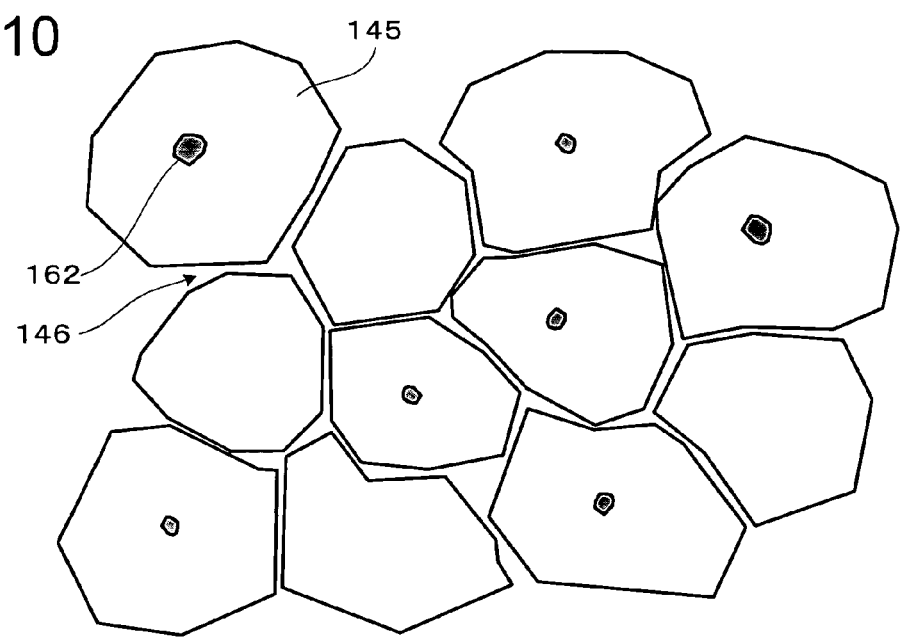
FIG. 10 is a bottom view showing a bottom face of the another example of the spacer layer.

Further, FIG. 8 to FIG. 10 are cross-sectional view, top view, and bottom view showing a cross-section, a top face, a bottom face of another example of the spacer layer 16, respectively, and correspond to FIG. 5 to FIG. 7.

In the structure in FIG. 8 to FIG. 10, the occupying area of the current paths 162 is smaller than in the structure in FIG. 5 to FIG. 7. As a result, the structure in FIG. 8 to FIG. 10 is an example of a case that the area resistance RA is higher than in the structure in FIG. 5 to FIG. 7.

Comparing with the structure in FIG. 5 to FIG. 7, the area of each current path 162 is smaller in the structure in FIG. 8 to FIG. 10. Further, in the structure in FIG. 8 to FIG. 10, small current paths 162 disappear and the number thereof is decreased. Except these points, the structure in FIG. 8 to FIG. 10 is the same as the structure in FIG. 5 to FIG. 7.

Such a current path 162 can be formed by thickening the film thickness of a non-oxide material. Specifically, resistance can be adjusted by forming not only the current paths 162 penetrating the oxide layer completely vertically but also current paths 162 of incomplete penetration or current paths 162 with smaller area of penetrating portions. This situation is illustrated in FIG. 8 to FIG. 10.

Here, center portions of the crystal grains 185, 145 can be defined as follows. As shown in FIG. 5, FIG. 6, FIG. 7, a straight line is drawn to transverse crystal grains 185, 145 of the free layer 18 and the pinned layer 14. At this time, the straight line is drawn to have the longest length to transverse the crystal grains 185, 145. On the straight line, one ends G0 and the other ends G1 of the crystal grain boundaries 186, 146 are defined as coordinate 0 and coordinate 100, respectively. At this time, a position located between coordinate 30 and coordinate 70 is defined as a center portion.

Arranging the current paths 162 immediately below the center portions of the crystal grains 185 of the free layer 18 is important for realizing a high MR ratio. As described above, for realizing a high MR ratio, it is important that the current confined in the current paths 162 passes through the crystal grains without inelastic scattering of conducted electrons in the crystal grain boundaries. Further, as described above, arranging the current paths 162 immediately above the center portions of the crystal grains 145 of the pinned layer 14 is also important for realizing a high MR ratio.

However, in the free layer 18, the crystal grains 185 are small and the crystal grain boundaries are close to the current paths 162. Accordingly, in the free layer 18, it is more needed that the current paths 162 are arranged at center portions of the crystal grains than in the pinned layer 14, and this positional relationship is important.

Positions of the current paths 162 relative to the center portions of the crystal grains 145 of the pinned layer 14 depend largely on forming conditions of the current paths 162. On the other hand, positions of the current paths 162 relative to the center portions of the crystal grains 185 of the free layer 18 depend on forming conditions of the free layer 18 in addition to the forming conditions of the current paths 162. The crystal structure of the free layer 18 cannot be controlled by the forming conditions of the current paths 162, and thus the forming conditions of the free layer 18 are also important. By later-described crystal growth treatment, the crystal grains 185 can be formed corresponding to the current paths 162, and crystallinity of those other than the crystal grains 185 immediately above the current paths 162 can be kept favorably.

A crystal grain boundary can be defined as a boundary portion between a portion (crystal grain) with the same crystal orientation and a portion (another crystal grain) different from that portion (crystal grain) in crystal orientation. Whether the crystal orientation is the same or not can be identified by electron diffraction spots in a TEM image. Incidentally, use of a dark field image is also an example of effective means for identifying crystal grains.

Here, when crystal grains are small, it may be difficult to identify individual crystal grains from the electron diffraction spots. This is because an electron micrograph is a picture which two-dimensionally projects an observed sample having a thickness in a depth direction. When many crystal grains exist in a depth direction of a measured sample, it is difficult to identify individual crystal grains due to electron beam interference of these crystal grains with each other.

In such a case, crystal grain boundaries can be identified by composition distribution of an alloy material by a three-dimensional atom probe.

Figure 11:
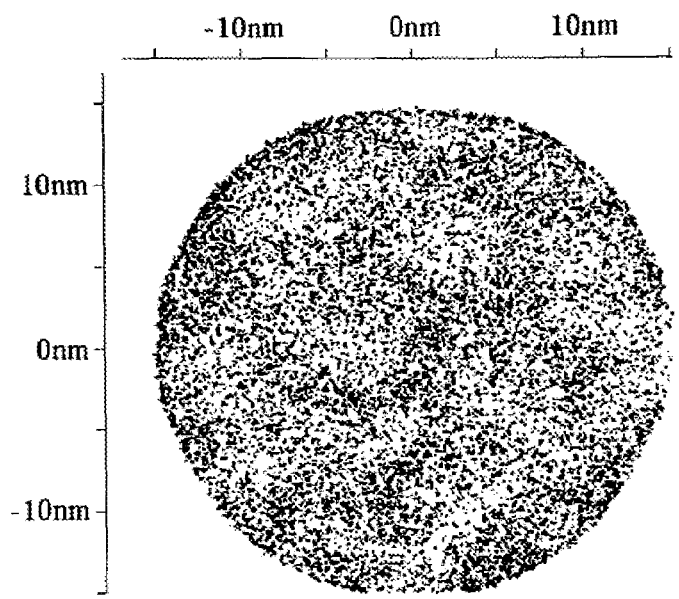
FIG. 11 is a view showing an example of a concentration distribution of Ni atoms in a free layer measured by a three-dimensional atom probe.
Figure 12:
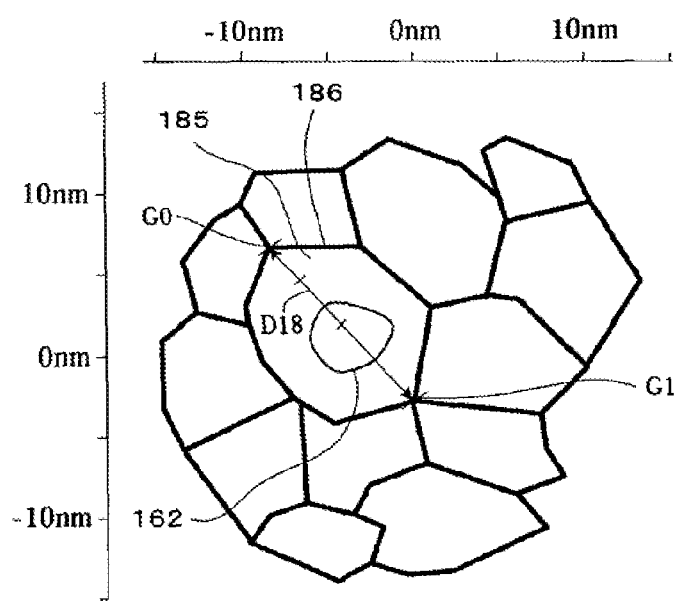
FIG. 12 is a view highlighting the concentration distribution of Ni atoms of FIG. 11.
Figure 13:
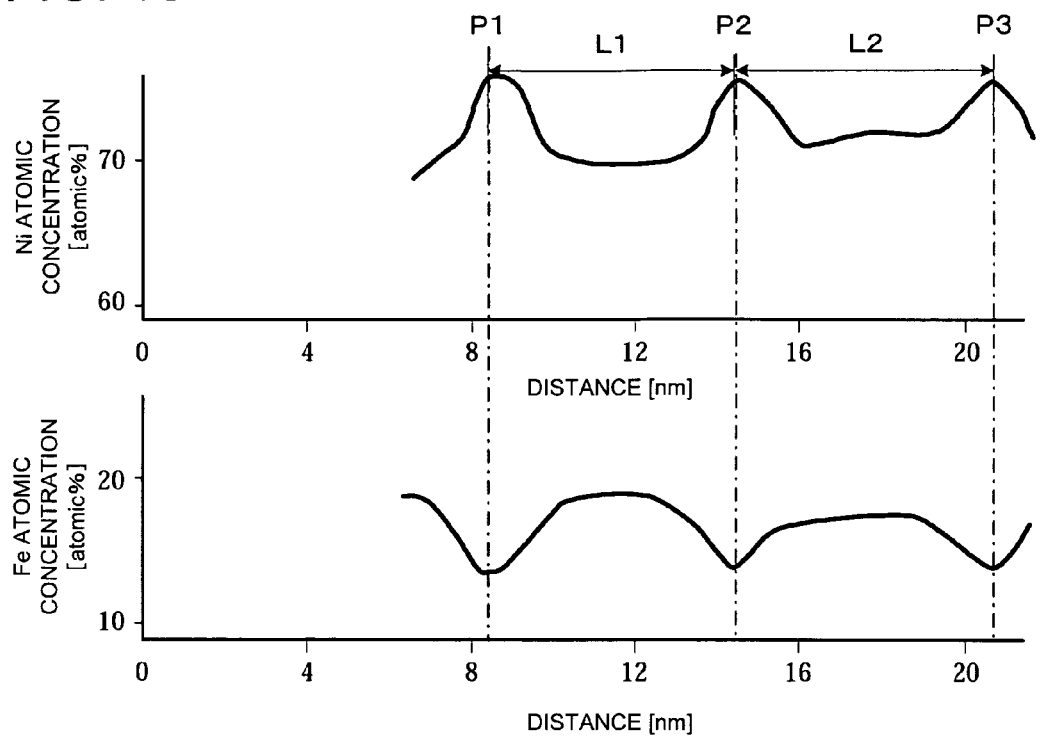
FIG. 13 is a view showing an example of a concentration gradient of Ni atoms in the free layer.

FIG. 11, FIG. 12, FIG. 13 are views showing an example of crystal grain boundaries of a case that a part of the free layer 18 is formed of NiFe. This free layer 18 is formed of CoFe/NiFe from the spacer layer 16 side.

FIG. 11 is a view showing an example of a concentration distribution of Ni atoms of the free layer 18 measured by the three-dimensional atom probe. FIG. 12 is a view highlighting the concentration distribution of Ni atoms of FIG. 11. The composition concentration of Ni in FIG. 11 is highlighted for more clearness. FIG. 13 is a view showing an example of a concentration gradient of Ni atoms in a film face of the free layer 18.

As shown in FIG. 13, as the concentration gradient of Ni, an Ni-rich part with a difference of 3% or more can be defined as a crystal grain boundary 186. Specifically, peaks P1 to P3 of the nickel concentration correspond to crystal grain boundaries 186, and distances L1, L2 therebetween correspond to grain diameters D18 of crystal grains 185 (here, approximately 6 nm).

Further, as shown in FIG. 13, an Ni-rich position is Fe-poor. Specifically, the inside of a crystal grain and a crystal grain boundary are different in microstructure, and thus a distribution is generated in a local composition. Since there are an element having high existence probability in a crystal grain and an element having high existence probability in a crystal grain boundary, a crystal grain region and a crystal grain boundary region can be identified by a composition mapping.

In the case of a crystal grain having a grain diameter of 3 nm or larger, which is the target in this embodiment, the crystal grain boundary has less volume as compared to the inside of the crystal grain. Accordingly, as shown in FIG. 13, it is possible to define only some regions with different compositions as crystal grain boundaries and the majority of regions with substantially constant compositions as inside of crystal grains.

When the size of a crystal grain is 1 nm or smaller or when it is an amorphous structure, a concentration distribution of composition barely occurs in this site and hence becomes flat. Here, a definition of existence of a concentration distribution of composition refers to a case that the concentration distribution is 3 atomic % or more.

This definition can be extended to a case that a composition of a magnetic material is different. Generally, a closed region (a loop of circular shape, square shape, hexagonal shape or the like) in which composition of an alloy magnetic material is different by 3 atomic % or more can be defined as a crystal grain. For example, in the case of an FeCo alloy, the inside of a two-dimensional closed region in a film face in which compositions of Fe and Co are different by 3 atomic % or more can be defined as a crystal grain.

In FIG. 12, in addition to the crystal grain boundary 186 defined in this manner, Cu constituting a current path 162 is also shown by projection. As can be seen from FIG. 12, Cu forming the current path 162 is arranged at a center portion of the crystal grain 185 of the free layer 18, namely a position where at least a part of the current path 162 exists in the range of coordinate 30 to coordinate 70. Further, at the center portion of the crystal grain 185 of the free layer 18, namely a position of coordinate 30 to coordinate 70, a region with highest Cu purity of the current path exists. Here, the lower metal layer 15 and the upper metal layer 17 are not shown. Only the center portion of the current path 162, namely, a region with the highest Cu concentration only is shown.

A method of observation with the three-dimensional atom probe microscope which enabled structural observation in FIG. 11 to FIG. 13 will be described in detail.

The three-dimensional atom probe microscope is a measurement method capable of three-dimensionally mapping composition information of a material in an atomic order. Specifically, a high-voltage is applied to a measurement target sample, which is processed to be a needle-shape post with a radius of curvature of 30 to 100 nm on the tip and a height of approximately 100 μm. Then, a position of an atom which is evaporated by an electric field from the tip of the measurement target sample is detected by a two-dimensional detector. By following passage of time (time base) of positional information of an atom in a (x, y) two-dimensional plane detected by the two-dimensional detector, depth information in a Z-direction is obtained, and thus observation of a (x, y, z) three-dimensional structure becomes possible.

The structures shown in FIG. 2 to FIG. 6 can be confirmed by, for example, Local Electrode Atom Probe of Imago Scientific Instruments Corporation.

FIG. 11 is a state showing only Ni of the free layer 18, and FIG. 12 shows Ni of the free layer 18 and the region with a high concentration of Cu only. Also inside the current path 162, a concentration gradient of Cu exists. Accordingly, if even a small amount of Cu is displayed, Cu in the upper metal layer 17 and Cu in the lower metal layer 15 are also displayed. In FIG. 12, in order to highlight only the current path 162, only a region with a Cu concentration of 50% or more in a 1 $nm^3$ cube is displayed. As a result, it is set to a state that the upper metal layer 17 or the lower metal layer 15 with a film thickness of 0.5 nm or smaller are not displayed. The lower metal layer 15 and the upper metal layer 17 are thinner as compared to the size of the current path 162. Accordingly, when displaying-only the region with a high Cu purity, only the center portion of the current path 162 is displayed.

It should be noted that although here the apparatus of Imago Scientific Instruments Corporation is used, the analyze can also be performed using Oxford Instruments, Cameca, or a three dimensional atom probe having an equivalent function.

Further, generally the electric field evaporation is generated by applying a voltage pulse, but a laser pulse may be used instead of the voltage pulse. In either case, a DC voltage is used for adding the bias electric field. In the case of the voltage pulse, an electric field needed for the electric field evaporation is applied by a voltage. In the case of the laser pulse, the electric field evaporation is generated by increasing a temperature locally to make a state that the electric field evaporation easily occurs.

In the case of an ultrathin layer, definition of an atomic composition itself is difficult. Accordingly, the film thickness can be defined based on a region in which Cu exists. In different layers, it is easy to relatively compare film thicknesses corresponding to regions in which Cu exists. For example, which of Cu in the lower metal layer 15 and Cu in the upper metal layer 17 is thicker can be determined even with a film thickness of the order of 0.1 nm.

(A Method of Manufacturing a Magnetoresistive Effect Element)

Hereinafter, a method of manufacturing a magnetoresistive effect element according to this embodiment will be described.

Figure 14:
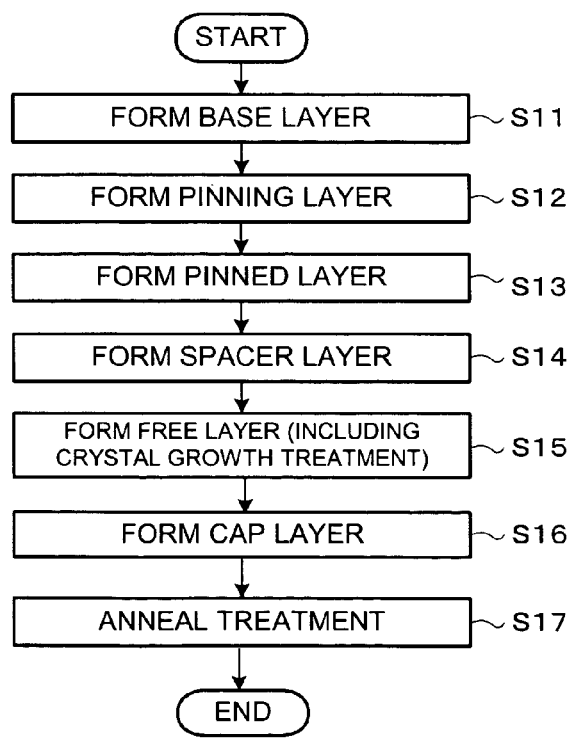
FIG. 14 is a flowchart showing an example of manufacturing steps of a magnetoresistive effect element.

FIG. 14 is a flowchart showing an example of manufacturing steps of the magnetoresistive effect element. Further, FIG.

15 is a schematic view showing an overview of a deposition apparatus used for manufacturing the magnetoresistive effect element.

Figure 15:
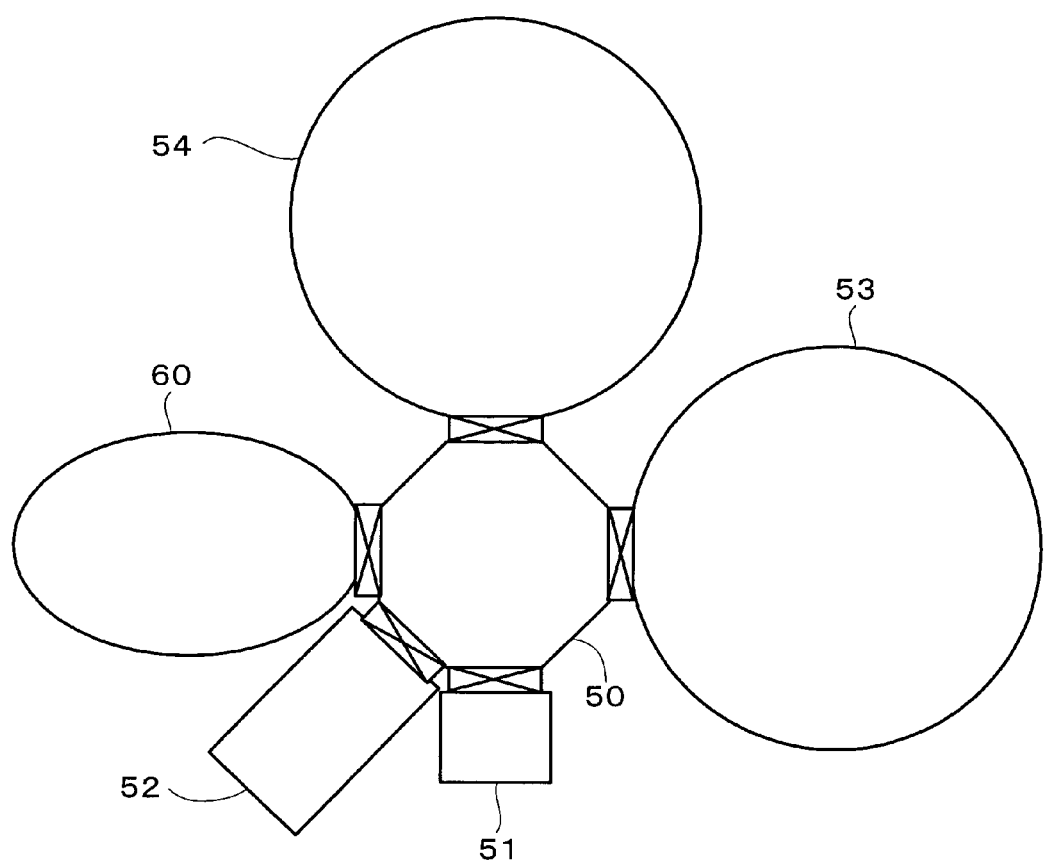
FIG. 15 is a schematic view showing an overview of a deposition apparatus used for manufacturing the magnetoresistive effect element.

As shown in FIG. 15, with a transfer chamber (TC) 50 being the center, a load lock chamber 51, a pre-cleaning chamber 52, a first metal film deposition chamber (MC1) 53, a second metal film deposition chamber (MC2) 54, and an oxide layer/nitride layer forming chamber (OC) 60 are provided via gate valves respectively. In this deposition apparatus, a substrate can be transferred in vacuum between respective chambers connected via the gate valves, so that the surface of the substrate is kept clean.

The metal film deposition chambers 53, 54 have multiple (5 to 10) targets. Examples of the deposition method include sputtering method such as DC magnetron sputtering, RF magnetron sputtering or the like, ion beam sputtering method, vapor deposition method, CVD (Chemical Vapor deposition) method, MBE (Molecular Beam Epitaxy) method, and the like.

As shown in FIG. 14, from a base layer 12 to a cap layer 19 are formed sequentially (Step S11 to Step S17).

On a substrate (not-shown), a lower electrode 11, a base layer 12, a pinning layer 13, a pinned layer 14, a lower metal layer 15, a spacer layer 16, an upper metal layer 17, a free layer 18, a cap layer 19, an upper electrode 20 are formed sequentially.

The substrate is set on a load lock chamber 51, and deposition of metal is performed in the metal deposition chambers 53, 54, and oxidization is performed in the oxide layer/nitride layer forming chamber 60. The degree of vacuum reached by the metal film deposition chamber is preferably $1 \times 10^{-8}$ Torr or lower, which is in general approximately $5 \times 10^{-10}$ to $5 \times 10^{-9}$ Torr. The degree of vacuum reached by the transfer chamber 50 is the order of $10^{-9}$ Torr. The degree of vacuum reached by the oxide layer/nitride layer forming chamber 60 is desirably $8 \times 10^{-8}$ Torr or lower.

(1) Forming the Base Layer 12 (Step S11)

The lower electrode 11 is formed in advance on the substrate (not shown) by a micro-fabrication process.

On the lower electrode 11, as the base layer 12, for example Ta [5 nm]/Ru [2 nm] is deposited. As already described, Ta is a buffer layer 12a for alleviating roughness on the surface of the lower electrode. Ru is a seed layer 12b for controlling the crystal orientation and the crystal grain diameter of the spin-valve film deposited thereon.

(2) Forming the Pinning Layer 13 (Step S12)

The pinning layer 13 is deposited on the base layer 12. As a material of the pinning layer 13, a ferromagnetic material such as PtMn, PdPtMn, IrMn, RuRhMn can be used.

(3) Forming the Pinned Layer 14 (Step S13)

The pinned layer 14 is formed on the pinning layer 13. The pinned layer 14 can be, for example, a synthetic pinned layer constituted of a lower pinned layer 141 ($Co_{90}Fe_{10}$ [3.6 nm]), a metal coupling layer 142 (Ru [0.9 nm]), and an upper pinned layer 143 (FeCo [1 nm]/Cu [0.25 nm]/FeCo [1 nm]/Cu [0.25 nm]/FeCo [1 nm]).

(4) Forming the Spacer Layer 16 (Step S14)

Next, the spacer layer (CCP-NOL) 16 having a current-confined-path structure (CCP structure) is formed. For forming the spacer layer 16, the oxide layer/nitride layer forming chamber 60 is used.

For forming the spacer layer 16, a method as follows is used. Here, an example will be described in which a spacer layer 16 including current paths 162 constituted of Cu having a metal crystal structure is formed in an insulating layer 161 formed of $Al_2O_3$ having an amorphous structure.

1) On an upper pinned layer 143, a lower metal layer 15 (first metal layer, for example Cu) to be a supply source for current paths is deposited, and thereafter a metal layer to be oxidized (second metal layer, for example AlCu or Al) which will be transformed into the insulating layer 161 is deposited on the lower metal layer 15.

The metal layer to be oxidized is pre-treated by irradiating an ion beam of rare gas (for example Ar) thereon. This pre-treatment is called PIT (Pre-ion treatment). As a result of this PIT, a state is generated that a part of the lower metal layer 15 is sucked up to enter the metal layer to be oxidized. Before performing oxidation treatment in this manner, it is important to perform energy treatment such as the PIT after deposition of the second metal layer. Performing the PIT with RF plasma using rare gas instead of the ion beam can achieve the equivalent effect.

Further, as treatment having the equivalent effect as the PIT, it is possible to perform preheat treatment before oxidation. In this case, as a temperature thereof, it is preferable to perform in the temperature range of 100 to 400° C. In either case of the PIT or the preheat treatment, it is important to perform in-situ in vacuum, and it is not preferable to expose the sample to the air.

At the time the lower metal layer 15 is deposited before performing the PIT, the first metal layer (lower metal layer 15: Cu layer) exists in a form of two-dimensional film. By the PIT step, Cu in the first metal layer is sucked up into the AlCu layer to enter therein. Cu entered the AlCu layer is kept in the metal state even after subsequent oxidation treatment is performed, or segregation of the oxide $Al_2O_3$ and the metal Cu is facilitated by the energy at the time of oxidizing, thereby becoming a current path 162. This PIT is important for realizing the current-confined-path structure (CCP) with a high Cu purity.

In the PIT step, Ar ions are irradiated under conditions of accelerating voltage 30 to 150 V, beam current 20 to 200 mA, and treatment time 30 to 180 sec. In the accelerating voltage, a voltage range of 40 to 60 V is preferable. In the case of a voltage range higher than this, decrease in the MR ratio may occur due to the influence of roughness of a surface or the like after the PIT. Also, a current value in the range of 30 to 80 mA and an irradiating time in the range of 60 to 150 sec can be used. Note that when using the RF plasma, similar condition ranges are preferable.

Further, instead of the PIT, there is also a method of forming the metal layer before being transformed into the insulating layer 161 such as AlCu or Al by means of bias sputtering. In this case, the energy of the bias sputtering can be 30 to 200 V in the case of DC bias and 30 to 200 W in the case of RF bias. Further, it is also possible to perform deposition while performing energy assist by an ion beam. In this case, the energy of the ion beam is preferably approximately 30 to 200 V.

As a result of the PIT, the final film thickness T15 of the lower metal layer 15 becomes thinner than a film thickness T15s (initial film thickness) at the beginning of deposition. This is because the lower metal layer 15 enters the non-oxide metal located thereabove and is sucked up therein. To keep the final film thickness T15 properly, it is necessary to consider decrease in film thickness due to the PIT. Concretely, the initial film thickness T15s of the lower metal layer 15 is adjusted according to the film thickness of the metal layer to be oxidized. Specifically, when the film thickness of the metal layer to be oxidized is thickened, the component of the lower metal layer 15 allowed to enter the metal layer to be oxidized must be increased during the PIT step, and thus it is necessary to thicken the initial film thickness T15s of the lower metal layer 15. For example, when the metal layer to be oxidized is AlCu with a film thickness of 0.6 to 0.8 nm, the initial film thickness T15s is set to approximately 0.1 to 0.5 nm. When the metal layer to be oxidized is AlCu with a film thickness of 0.8 to 1 nm, the initial film thickness T15s is set to approximately 0.3 to 1 nm.

For realizing current paths 162 of high-purity with a favorable structure, it is preferable to perform the PIT. However, instead of the PIT, AIT (after-ion treatment) for performing ion-beam or RF plasma treatment after the oxidation treatment may be performed. This will be described later.

If the initial film thickness T15s of the lower metal layer 15 is too thin, the component of the lower metal layer 15 is not supplied sufficiently to the metal layer to be oxidized during the PIT step, which makes it difficult to allow penetration of the current path 162 to an upper portion of the metal layer to be oxidized. As a result, the area resistance RA becomes excessively high, and the MR ratio becomes an insufficient value.

On the other hand, if the initial film thickness T15s of the lower metal layer 15 is too thick, it is possible that the final film thickness T15 of the lower metal layer 15 is too large. As already described, it is desirable that the final film thickness T15 of the lower metal layer 15 is 1 nm or lower. If the film thickness is larger than this, the current-confined-path effect is lost, and the increasing effect of the MR ratio is lost.

2) Next, oxidation gas (for example, oxygen) is supplied to oxidize the metal layer to be oxidized to form the insulating layer 161. At this time, conditions are selected such that the current paths 162 are not oxidized and remain as they are. By this oxidation, the metal layer to be oxidized is converted into the insulating layer 161 constituted of $Al_2O_3$, thereby forming the current paths 162 penetrating the insulating layer 161 and forming the spacer layer 16.

For example, oxidation gas (for example, oxygen) is supplied while irradiating an ion beam of rare gas (such as Ar, Xe, Kr, He), thereby oxidizing the metal layer to be oxidized (ion beam assisted oxidation (IAO)). By this oxidation treatment, the spacer layer 16 having the insulating layer 161 constituted of $Al_2O_3$ and the current paths 162 constituted of Cu is formed. It is a treatment using the difference in oxidation energy such that Al is easily oxidized and Cu is not easily oxidized. It is desirable that the oxidation gas is introduced directly to the oxidizing chamber, but in the case of oxidation using an ion gun, oxygen may be introduced into the ion source.

In this step, while supplying oxygen, Ar ions are irradiated under conditions of accelerating voltage 40 to 200 V, beam current 30 to 200 mA, and treatment time 15 to 300 sec. In the above accelerating voltage, a voltage range of 50 to 100 V is preferable. If the accelerating voltage is higher than this, decrease in the MR ratio may occur due to the influence of roughness of a surface or the like during the IAO. Also, a beam current of 40 to 100 mA and an irradiating time of 30 to 180 sec can be adopted.

As the oxygen supply amount during oxidation by the IAO, 2000 to 4000 L is a preferable range. During the IAO, if not only Al but also the lower magnetic layer (pinned layer 14) is oxidized, it decreases heat resistance and reliability of the CCP-CPP element and thus is not favorable. For improving the reliability, it is important that the magnetic layer (pinned layer 14) located below the spacer layer 16 is not oxidized and is in a metal state. For realizing this, the oxygen supply amount needs to be in the above range.

Further, in order to form a stable oxide by supplied oxygen, it is desirable that the oxygen gas is allowed to flow only while the ion beam is irradiated on the substrate surface. Specifically, it is desirable that the oxygen gas is not allowed to flow when the ion beam is not irradiated on the substrate surface.

As the material of the first metal layer (lower metal layer 15) forming the current paths 162, Au, Ag or the like may be used instead of Cu. However, Cu has higher stability for heat treatment as compared to Au, Ag, and thus is preferable. As the material of the first metal layer, instead of these non-magnetic materials, a magnetic material may be used. Examples of the magnetic material include Co, Fe, Ni and an alloy thereof.

When the magnetic material used for the pinned layer 14 and the magnetic material used for the current paths 162 are the same, it is not necessary to deposit the supply source (first metal layer) for the current paths 162 on the pinned layer 14. Specifically, after the second metal layer to be transformed into the insulating layer 161 is deposited on the pinned layer 14, the material of the pinned layer 14 is made to enter the second metal layer by performing the PIT step, and thereby the current paths 162 constituted of a magnetic material can be formed.

When $Al_{90}Cu_{10}$ is used for the second metal layer, not only Cu in the first metal layer is sucked up during the PIT step, but also Cu in the AlCu is separated from Al. Specifically, from both the first and second metal layers, the current paths 162 are formed. When the ion beam assisted oxidation (IAO) is performed after the PIT step, oxidation proceeds while separation of $Al_2O_3$ and Cu is facilitated during oxidation by an assist effect by the ion beam. Specifically, by the energy assist effect by the ion beam, Al is easily oxidized and Cu is easily subjected to reduction, and CCP with Cu of high purity is easily formed.

Here, although an ion beam is used as the IAO, an RF plasma may be used instead of the ion beam. Also in this case, appropriate ranges of voltage, current, oxygen amount, treatment time are similar to those for the IAO.

As the second metal layer, instead of $Al_{90}Cu_{10}$, a single metal of Al not including Cu that is the constituting material of the current path 162 may be used. In this case, Cu as the constituting material of the current paths 162 is supplied only from the first metal layer as the base. When AlCu is used as the second metal layer, Cu as a material for the current paths 162 is also supplied from the second metal layer during the PIT step. Accordingly, when forming a thick insulating layer 161, the current paths 162 can be formed relatively easily. When Al is used as the second metal layer, it becomes difficult for Cu to mix with $Al_2O_3$ formed by oxidation, and hence $Al_2O_3$ with high voltage resistance can be formed easily. Since Al and AlCu have respective merits, they can be used properly depending on a situation.

As AlCu as the second metal layer, one having a composition expressed by $Al_xCu_{100-1}$ (x=100% to 70%) is preferable. To AlCu, an element such as Ti, Hf, Zr, Nb, Mg, Mo, Si may be added. In this case, the composition of an added element is preferably approximately 2 to 30%. When these elements are added, it is possible that formation of the CCP structure becomes easy. Further, when these additive elements are distributed richer to a boundary region of the insulating layer 161 of $Al_2O_3$ with the current paths 162 of Cu than to other regions, adhesiveness of the insulating layer 161 and the current paths 162 improves, and then electro-migration resistance may improve. In the CCP-CPP element, the density of a current flowing in a metal path of the spacer layer 16 becomes a giant value as $10^7$ A to $10^{10}$ A/cm$^2$. Accordingly, it is important that the electro-migration resistance is high, and the stability of the Cu current paths 162 while conducting a current can be assured. However, when an appropriate CCP structure is formed, sufficiently good electro-migration resistance can be realized without adding an element to the second metal layer.

The material of the second metal layer is not limited to an Al alloy for forming $Al_2O_3$, which may be an alloy with a main component such as Hf, Mg, Zr, Ti, Ta, Mo, W, Nb, Si. Further, the insulating layer 161 converted from the second metal layer is not limited to an oxide, which may be a nitride or an oxynitride.

When any kind of material is used for the second metal layer, a film thickness thereof at the time of deposition is preferably 0.5 to 2 nm. Further, a film thickness at the time of conversion into an oxide, a nitride or an oxinitride is preferably approximately 1.0 to 3.0 nm, more preferably 1.5 to 2.5 nm.

The insulating layer 161 may be not only oxides each including a single element but also an oxide, a nitride, an oxynitride of an alloy material. For example, with $Al_2O_3$ being a base material, any one element of Ti, Mg, Zr, Ta, Mo, W, Nb, Si and the like, or an oxide or the like of a material containing 0 to 50% of plural elements in Al may be used.

As already described, the component sucked up from the lower metal layer 15 by the PIT constitutes the current paths 162. At this time, the lower metal layer 15 immediately above the crystal grains 145 of the pinned layer 14 is sucked up with priority to become the current paths 162, so that the crystal grains 145 and the current paths 162 are arranged to correspond with each other.

By the PIT, Cu in the lower metal layer 15 is gathered to center portions of the crystal grains 145 of the pinned layer 14 (the lower metal layer/non-oxide metal layer are of the same crystal grains) and sucked up from the center portions of the crystal grains 145 to the non-oxide metal layer surface, and comes up to the upper layer. Specifically, the lower metal layer 15 located below the non-oxide metal layer turns to a state that the material of the lower metal layer 15 is sucked up along a film thickness direction at the center portions of the crystal grains 145 to penetrate or half-penetrate in the film thickness direction.

By the IAO after this treatment, Al-rich regions are oxidized. On the other hand, Cu-rich regions of the constituting material of the lower metal layer 15 gathered to the center portions of the crystal grains 145 remain without being oxidized by the IAO, thereby forming the current paths 162.

The film thickness T16 of the insulating layer 161 is determined by the film thickness of the second metal layer (metal layer to be oxidized). The film thickness of the second metal layer is 0.6 to 2 nm in the case of AlCu, and approximately 0.5 to 1.7 nm in the case of Al. The film thickness T16 of the insulating layer 161 formed by the second metal layer being oxidized is preferably approximately 1.0 to 3.0 nm, more preferably 1.5 to 2.5 nm.

In order to realize a favorable structure for the current paths 162, here the current paths 162 are formed by the PIT/IAO.

However, instead of the PIT, by performing treatment with an ion beam of rare gas such as Ar, Xe, Kr or with plasma of rare gas after the IAO, favorable current paths 162 can be formed. This treatment is called AIT (after-ion treatment) since it is treatment performed after oxidation. Specifically, it is also possible to form the current paths 162 by IAO/AIT.

In the PIT, segregation of Cu and Al is realized before oxidation. On the other hand, in the AIT, after Al is oxidized to $Al_2O_3$ by the IAO, segregation of $Al_2O_3$ and Cu is facilitated. It is possible to facilitate such segregation by collision of energy of an ion beam or plasma during the AIT.

Further, it becomes possible to reduce oxygen in a forming portion of a partly oxidized current path 162. Specifically, when the constituting material of the current path 162 is Cu, Cu of metal state can be formed by reducing oxygen in $CuO_x$ formed by the IAO by the AIT.

In the AIT, under conditions of acceleration voltage 50 to 200 V, current 30 to 300 mA, and treatment time 30 to 180 sec, an ion beam containing rare gas such as Ar, Kr, He, Ne, Xe or plasma (such as RF plasma) is irradiated on the surface of the second metal layer.

In the case of an ion beam, the acceleration voltage and the current can be controlled independently. On the other hand, in the case of RF plasma or the like, the acceleration voltage and the current are automatically determined when the inputted RF power is determined, and thus it is difficult to control the acceleration voltage and the current independently.

However, the RF plasma has a merit that maintenance of the apparatus is easy. Therefore, according to a condition of the apparatus, either of the ion beam or the RF plasma can be used.

In the IAO/AIT, preferable conditions of IAO are the same as in the above-described case. Further, film structures and materials are the same as in the above-described case of the PIT/IAO.

In the AIT, it is necessary to perform relatively stronger energy treatment than the PIT after oxidation, and thus an interlayer coupling field between the pinned layer 14 and the free layer 18 becomes large easily. This is because unevenness of the surface of the insulating layer 161 of the spacer layer 16 increases by the AIT, which may increase Neel coupling (Orange peel coupling). Such a problem does not exist in the PIT, and hence the PIT is a more preferable process.

In addition to the case of performing the AIT instead of the PIT, the AIT may be performed also in the case of performing the PIT. In other words, it is possible to perform three treatments, PIT/IAO/AIT.

In this case, for the purpose of allowing separation of a minute amount of absorbed floating oxygen remained after the IAO, it is preferable to perform the AIT with relatively weak energy as compared to the case without the PIT. A concrete example of AIT conditions in this case are as follows. Specifically, under conditions of acceleration voltage 50 to 100 V, current 30 to 200 mA, and treatment time 10 sec to 120 sec, an ion beam containing rare gas such as Ar, Kr, He, Ne, Xe or plasma (such as RF plasma) is irradiated on the surface.

The diameter D16 of a current path 162 is determined as the following 1), 2).

1) By cross-sectional TEM observation, the diameter T16 of a current path 162 can be determined. By the cross-sectional TEM observation, a current path 162 having a crystal structure and an oxide insulating material can be identified. Specifically, when the oxide insulating material has an amorphous structure, the current path 162 and the oxidized material 161 can be identified.

However, by this method, a current path 162 with a large diameter D16 can be identified, but a current path 162 with a small diameter D16 cannot be detected. This is because, as described above, information of small crystal grains disappears since a TEM measurement image is a two-dimensionally projection of an object that actually has a thickness in the depth direction of observation. Taking such problems into account, as the diameter D16 of a current path 162, a diameter of approximately 4 nm or larger can be identified.

2) By observation with a three-dimensional atom probe, the diameter D16 of a current path 162 can be determined.

In this case, the constituting material of the current path 162 and the oxidized insulating material can be identified as composition concentration gradients. When the current path 162 is formed with a material having Cu as a main element, a one-dimensional concentration profile is examined in a plane direction of the film, and the diameter D16 can be defined by a half value width of Cu concentration from a point where the Cu concentration is largest.

(5) Forming the Upper Metal Layer 17, the Free Layer 18 (Step S15)

On the spacer layer 16, as an upper metal layer 17, for example, Cu is deposited. This upper metal layer 17 is important since it exhibits a function as a seed layer for facilitating crystal orientation of the free layer 18 to be deposited thereon. Further, it also exhibits a function as a barrier layer to prevent oxygen (or nitrogen) in the insulating layer 161 formed with an oxide material from directly contacting the free layer 18.

In view of these functions only, the upper metal layer 17 is advantageous as it becomes thick, but the influence of a spreading current arises as it becomes thick. In the CCP-CPP element, by a current confined in the spacer layer 16 flowing into the pinned layer 14 or the free layer 18, the MR ratio improves. However, when the current spreads in the upper metal layer 17, the merit of improving the MR ratio by the CCP is lost.

Thus, since the film thickness of the upper metal layer 17 is in a trade-off relationship, there exists an optimum film thickness. Concretely, it is preferably 0.2 to 1.5 nm, more preferably 0.3 to 1.0 nm.

On the upper metal layer 17, the free layer 18, for example $Co_{90}Fe_{10}$ [1 nm]/$Ni_{83}Fe_{17}$ [3.5 nm] is formed.

To obtain a high MR ratio, selection of the magnetic material for the free layer 18 located at the interface with the spacer layer 16 is important. In this case, at the interface with the spacer layer 16, it is preferable to provide a CoFe alloy rather than an NiFe alloy. Among CoFe alloys, $Co_{90}Fe_{10}$ [1 nm] which has particularly stable soft magnetism characteristic can be used. The CoFe alloy can be used also with a different composition.

When a CoFe alloy close to $Co_{90}Fe_{10}$ is used, a film thickness thereof is preferably 0.5 to 4 nm. When a CoFe alloy with a different composition (for example, $Co_{50}Fe_{50}$) is used, a film thickness thereof is preferably 0.5 to 2 nm. When $Fe_{50}Co_{50}$ (or $Fe_xCo_{100-x}$ (x=45 to 85)) is used for the free layer 18 for example in order to increase the spin-dependent interface scattering effect, it is difficult to use a large film thickness such as the pinned layer 14 for keeping the soft magnetism as the free layer 18. Accordingly, 0.5 to 1 nm is a preferable film thickness range. When Fe not including Co is used, a film thickness thereof can be approximately 0.5 to 4 nm since it has a relatively favorable soft magnetism characteristic.

The NiFe layer to be provided on the CoFe layer is constituted of a material with a stable soft magnetism characteristic. The soft magnetism characteristic of the CoFe alloy is not so stable, but the soft magnetism characteristic can be compensated by providing an NiFe alloy thereon. Using NiFe as the free layer 18 allows use of a material which can realize a high MR ratio at the interface with the spacer layer 16 and thus is preferable in terms of total characteristics of the spin-valve film.

The composition of the NiFe alloy is preferably $Ni_xFe_{100-x}$ (x=approximately 75 to 90%). Here, it is preferable to use an Ni-rich composition (for example, $Ni_{83}Fe_{17}$) rather than the normally used NiFe composition $Ni_{81}Fe_{17}$. This is for realizing zero magnetostriction. In NiFe deposited on the spacer layer 16 of the CCP structure, magnetostriction shifts to the plus side than in NiFe deposited on the spacer layer made of metal Cu. To cancel the shift of magnetostriction to the plus side, an NiFe composition on the negative side which has a larger Ni composition than a usual case is used.

The total film thickness of the NiFe layer is preferably approximately 2 to 5 nm (for example, 3.5 nm). When the NiFe layer is not used, a free layer 18 made by alternately layering plural CoFe layers or Fe layers of 1 to 2 nm and plural ultrathin Cu layers of approximately 0.1 to 0.8 nm may be used.

Crystal growth treatment is performed on the free layer 18. This crystal growth treatment is a kind of energy treatment by which formation of the crystal grains 185 of the free layer 18 on the current paths 162 is facilitated.

As the crystal growth treatment, both of treatment with ion or plasma and heat treatment can be used, but the former is preferable. This is because control of a treatment range is possible in the former.

Specifically, in treatment by means of ion beam or RF plasma, it is possible to treat only the film surface and not to treat a lower layer thereof by selecting treatment conditions. On the other hand, in heat treatment, control of a treatment range is difficult. By the heat treatment, diffusion or the like in an interface of a layered film below the spacer layer 16 occurs, which may deteriorate the characteristics of the spin-valve film.

Examples of the treatment by means of ion or plasma include not only a method of performing energy treatment after deposition but also a method of performing energy treatment simultaneously with the deposition process such as deposition by means of bias sputtering, irradiation of ion beam or RF plasma during deposition, and so forth.

As a method of performing deposition and energy treatment separately, there is a method of performing the following processes (1) to (4).
(1) Deposition of a part (or the whole) of the free layer
(2) Energy treatment (ion beam, RF plasma, heat treatment)
(3) Deposition of a part (or the whole of rest) of the free layer
(4) Energy treatment (ion beam, RF plasma, heat treatment)

Here, when the entire free layer 18 is formed in the processes (1), (2), the processes (3), (4) can be omitted. It is also possible to perform the processes (1), (2), (3) and omit the process (4).

On the other hand, as the method of performing deposition and energy treatment simultaneously, there is a method of applying an ion beam, RF plasma, or DC bias or heating a substrate simultaneously with a deposition process.

As described above, this crystal growth treatment may be either of separate treatment from deposition of the free layer 18 or treatment simultaneous with the deposition.

By treating the constituting material of the free layer 18 with ion, plasma, or heat, the crystal grains 185 of the free layer 18 grow on the current paths 162.

As an example, after CoFe is deposited by 1 nm, NiFe is deposited by 2.5 nm, and as crystal growth treatment, RF plasma treatment of 30 to 150 W is performed for 60 to 120 sec. Thereafter, NiFe is deposited by 2 nm, and as crystal growth treatment, RF plasma treatment of 30 to 150 W is performed for 60 to 120 sec.

The diameter D18 of the crystal grain 185 of the free layer 18 is controlled by conditions of crystal growth treatment. For example, in the case that the crystal growth treatment is of relatively strong energy, the crystal grain diameter of the free layer 18 can be made large, and when the crystal growth treatment is weak, the crystal grain diameter of the free layer 18 becomes small.

However, the crystal growth treatment generates a problem either when it is too weak or when it is too strong, and thus care must be taken of conditions thereof. First, if this treatment is too weak, the crystallinity of the free layer 18 tends to be poor. The crystallinity of the crystal grains 185 immediately above the current paths 162 is relatively good, but the crystallinity of the crystal grains 185 of the free layer 18 which is not immediately above the current paths 162 tends to be poor. In particular, when the constituting material of the insulating layer 161 is amorphous, deterioration of crystallinity thereof is significant. Thus, in order to obtain a favorable free layer 18, the crystal growth treatment is necessary.

On the other hand, when this treatment is too strong, the surface of the free layer 18 becomes rough. In the worst case, the oxidation state of the insulating layer 161 may even be destroyed.

Here, a strong condition means a large acceleration voltage or a large ion current in the case of ion beam or RF plasma, and a high temperature in the case of heat treatment. In the case of bias sputtering or the like, it may be a large RF power, a large value of DC bias, a large acceleration voltage of an ion beam, a large amount of current, and the like.

(6) Forming the Cap Layer 19 and the Upper Electrode 20 (Step S16)

On the free layer 18, as the cap layer 19, for example Cu [1 nm]/Ru [10 nm] are layered. On the cap layer 19, the upper electrode 20 for conducting a current perpendicularly to the spin-valve film is formed.

(7) Anneal Treatment (Step S17)

The magnetoresistive effect film 10 formed in the processes of the steps S11 to S16 is annealed in a magnetic field, thereby fixing the magnetization direction of the pinned layer 14.

Example 1

Hereinafter, an example of the present invention will be described. The structure of a magnetoresistive effect film 10 according to the example of the present invention is shown below.

lower electrode 11
base layer 12: Ta [5 nm]/Ru [2 nm]
pinning layer 13: PtMn [15 nm]
pinned layer 14: CoFe [3.4 nm]/Ru [0.9 nm]/(FeCo [1 nm]/Cu [0.25 nm])*2/FeCo [1 nm]
lower metal layer 15: Cu [0.2 nm] (a finally formed film thickness, not a film thickness at the time of deposition)
spacer layer 16 (CCP-NOL)
upper metal layer 17: Cu [0.4 nm] (a finally formed film thickness, not a film thickness at the time of deposition)
free layer 18: CoFe [1 nm]/NiFe [3.5 nm]
cap layer 19: Cu [0.5 nm]/Ru [5 nm]

In this example, RA is 300 m$\Omega\mu m^2$ and the MR ratio is 9%, corresponding to the structures in FIG. 5 to FIG. 7. In FIG. 5 to FIG. 7, the film thickness of the insulating layer 161 forming the CCP-NOL is 1.8 nm.

The crystal grains 145 in the pinned layer 14 have a grain diameter D14 of approximately 13 to 16 nm, and the current paths 162 are arranged immediately above center portions of the crystal grains 145. Further, the crystal grains 185 of the free layer 18 have grain diameters D18 of approximately 4 to 7 nm, and the current paths 162 are arranged immediately below the center portions of the crystal grains 185.

Specifically, the crystal grain boundaries 186 of the free layer 18 do not exist immediately above the current paths 162. This fact does not only keep the MR ratio favorable, but is very important for realizing favorable reliability.

Also in the free layer 18 other than immediately above the current paths 162, crystal grains 185 were formed, and the grain diameters D18 thereof were 3 to 5 nm. Since the free layer 18 is formed of such small crystal grains 185, the soft magnetism of the free layer 18 is highly favorable. Moreover, it does not lead to large decrease in MR ratio, and realizes both the favorable MR ratio and favorable soft magnetism.

Further, in the spacer layer 16 as the CCP-NOL here, the insulating layer 161 is $Al_2O_3$, and the current paths 162 have Cu as the main component. Diameters D16 of the current paths 162 are 2 nm to 5 nm. By observation with the three-dimensional atom probe, Cu concentration in a current path 162 part having a diameter D16 of 5 nm was 60 to 70 atomic %. On the other hand, Cu purity in an oxygen-rich insulating layer 161 part was approximately 10 atomic %. Thus, clear segregation (separation) of Cu is confirmed in the current path 162 part and the other part.

The insulating layer 161 part of $Al_2O_3$ is not formed only of Al and O, but approximately a few to 10% of Cu, Ni, Co, Fe are mixed as impurities. However, the breakdown voltage of the spacer layer 16 part is at least two hundred and several tens mV or larger, which is larger than a voltage of approximately 80 to 120 mV which is actually used as an operating voltage and has a sufficient withstand voltage.

The lower metal layer 15 and the upper metal layer 17 are both formed of Cu, and are as ultrathin as 0.2 and 0.4 nm, respectively. Accordingly, when the three-dimensional atom probe is used, these atomic compositions become different depending on the manner of defining them. When the volume region of a measurement target (the lower metal layer 15 and the upper metal layer 17) is made deep in a film thickness direction, the Cu concentration in the measurement target becomes significantly low. The atomic composition thereof differs significantly as compared to a case that the volume region of a measurement target is wide in a plane direction.

A film thickness 0.2 nm corresponds to 1 to 2 atomic layers, and a film thickness 0.4 nm corresponds to 3 to 4 atomic layers. Accordingly, a film thickness can be defined by atomic layers of Cu detected at positions above and below the current paths 162 and the insulating layer 161. For example, when one or two atom layers are detected, the film thickness is defined as 0.2 nm, and when three or four atomic layers are detected, the film thickness is defined as 0.4 nm.

In an example corresponding to FIG. 8 to FIG. 10, the resistance is set higher and the current paths 162 are reduced than in the structure of FIG. 5 to FIG. 7. In this example, the area resistance RA is 600 m$\Omega\mu m^2$ and the MR ratio is 9.5%. The area resistance RA becomes high due to decrease in occupying area of the current paths 162 or decrease in the number thereof.

In order to decrease the occupying area of the current paths 162, the film thickness of AlCu before oxidation is made thick. The film thickness T16 of the insulating material after oxidation is 2.1 nm. Also in the case that RA increases from 300 to 600 m$\Omega\mu m^2$, the current paths 162 are formed immediately under the crystal grains 185 of the free layer 18. Further, the current paths 162 are formed immediately above the crystal grains 145 of the pinned layer 14.

However, as compared to FIG. 5 to FIG. 7, in FIG. 8 to FIG. 10 there exist current paths 162 in middle of formation whose penetration in a vertical film thickness direction is incomplete, which decrease the occupying ratio of the current paths 162 in a two-dimensional plane of the spacer layer 16. Such current paths 162 in middle of formation may cause variation in long-term reliability.

Such current paths 162 which are failed to penetrate may be a small area, and thus they are better to be formed completely. Accordingly, after producing the element, initialize treatment (current path initialize treatment) for allowing penetration of incomplete metal paths is carried out as necessary. Specifically, a voltage in a pulse form of approximately 140 mV or larger and 300 mV or smaller is applied by a unit of a few μ seconds to a few seconds. Alternatively, a DC voltage of approximately 140 mV or larger and 300 mV or smaller is applied by a unit of few minutes.

By current path initialize treatment, it is possible to allow penetration of current paths 162 which did not penetrate, the area resistance RA after the treatment decreases slightly as compared to before the treatment. Although depending on conditions, it is also possible to change the area resistance RA from 600 to 400 mΩμm$^2$ by the current path initialize treatment. This voltage range is preferably 140 mV or larger and 300 mV or smaller. When incomplete current paths 162 are eliminated, diameters D16 of current paths 162 are reflected as they are to the area resistance RA. In such a state, the increase in current density accompanying the decrease in diameters D16 of current paths 162 does not affect the reliability so much.

The above-described element with the area resistance RA of 300 mΩμm$^2$ and the MR ratio of 9% is subjected to a current conduction test. In the CCP, since a local current density becomes a huge value of $10^8$ A/cm$^2$ or larger, local heat development is large, and influence of physical attack by electrons is also large. Therefore, in order to make reliability of the CCP favorable, it is necessary to control the microstructure thereof. In the microstructure as shown in FIG. 2, crystal grains having good crystallinity are arranged above and below the CCP. Thus, influence of diffusive electron scattering in a crystal grain boundary becomes small, and it becomes possible to make the reliability favorable.

Conditions of the current conduction test are temperature of 130° C. and bias voltage of 140 mV. This temperature is a larger value than an actually used value, and is a condition for acceleration. By adopting such conditions severer than normal use conditions, difference in reliability appears in a short-term test. Further, a current conducting direction is set such that a current flows from the pinned layer 14 to the free layer 18. Specifically, the flow of electrons is in a reverse direction, and thus they flow from the free layer 18 to the pinned layer 14. Such a current conducting direction is a desirable direction for reducing spin transfer noise. It is said that the case of passing a current from the free layer 18 to the pinned layer 14 (a flow of electrons is from the pinned layer 14 to the free layer 18) has a larger spin transfer torque effect, which can cause noise in a head. Also in this view, it is preferable that the current conducting direction is from the pinned layer to the free layer 18, and the flowing direction of electrons is from the free layer 18 to the pinned layer 14.

As the test conditions here, since it is an accelerated test, in addition to making the temperature higher than a usual condition, a severe condition is also imposed on the element size. In the example, the element size is made larger than an element size in an actual head (in practice, an element size smaller than 0.1 μm×0.1 μm).

When the element size is larger while a bias voltage is of the same condition, the amount of an inputted current becomes large, and the influence of Joule heat becomes large. Specifically, it is severe comparison in a place where the heat amount is larger than the case of an actual small element. Furthermore, when the element size is large, a heat generating portion becomes large, which worsens heat release performance of the element. On the other hand, in the case of a small element, a heat sink exists around it, which is therefore an environment where heat can be released easily.

By these two reasons, the element of the example is tested with severe conditions which have a much larger influence of heat than in an element in an actual head. As compared with the above-described effect of the temperature, these conditions tested where the element size is large make the test conditions more severe. Namely, these are accelerated test conditions set for judging whether reliability is good or poor in a short period of time.

In this embodiment, it is confirmed that the reliability in current conduction test is very good. Specifically, a very good value of 10% or less of a deterioration amount after 60 hours is obtained. This reliability can assure long term use in an actual operating environment.

On the other hand, one which does not have a microstructure according to this embodiment showed a deterioration amount of 40 to 60%. Specifically, that is a case that the crystal grain boundaries 186 of the free layer 18 exist immediately above the current paths 162.

The fact that the reliability of the element in the example is good in the severe conditions means that the magnetoresistive effect element according to this embodiment can be used in an environment requiring high reliability. In a head corresponding to high density recording, it becomes possible to realize a head having significantly higher reliability than conventional ones. This head corresponding to high density recording can be used under use conditions that require severe reliability specifications, for example, in an HDD (hard disk drive) for a car navigation application used in a high-temperature environment, a server used at high speed, an enterprise application, and the like. As a matter of course, it can be used for a regular HDD application such as a regular personal computer application or home video application, a mobile music player, a mobile motion picture player, a mobile video, and the like.

Further, in this test, the current conducting direction is a direction of a current flowing from the pinned layer 14 to the free layer 18, and this current conducting direction had a larger effect in improvement of reliability than the reverse current conducting direction thereof. The current conducting direction is also advantageous for reducing spin transfer noise, which means that a head with low-noise and higher reliability can be realized.

(Application of the Magnetoresistive Effect Element)

Hereinafter, an application of the magnetoresistive effect element (CCP-CPP element) according to the embodiment of the present invention will be described.

In the embodiment of the present invention, the element resistance RA of the CPP element is preferably 500 mΩμm$^2$ or lower, more preferably 300 mΩμm$^2$ or lower in view of correspondence to high density. When calculating the element resistance RA, the resistance R of the CPP element is multiplied by the effective area A of a current conducting portion of the spin-valve film. Here, the element resistance R can be measured directly. On the other hand, the effective area A of the current conducting portion of the spin-valve film is a value depending on the element structure, and therefore it should be determined carefully.

For example, when the entire spin-valve film is patterned as a region which performs sensing effectively, the area of the entire spin-valve film becomes the effective area A. In this case, in view of appropriately setting the element resistance, the area of the spin-valve film is set to at least 0.04 μm$^2$ or smaller, or to 0.02 μm$^2$ or smaller for the recording density of 200 Gbpsi or larger.

However, when the lower electrode 11 or the upper electrode 20 in contact with the spin-valve film and smaller than the spin-valve film is formed, the area of the lower electrode 11 or the upper electrode 20 is the effective area A of the spin-valve film. When the areas of the lower electrode 11 and the upper electrode 20 are different, the area of the smaller electrode is the effective area A of the spin-valve film. In this case, in view of appropriately setting the effective element, the area of the smaller electrode is set to at least 0.04 µm² or smaller.

Figure 16:
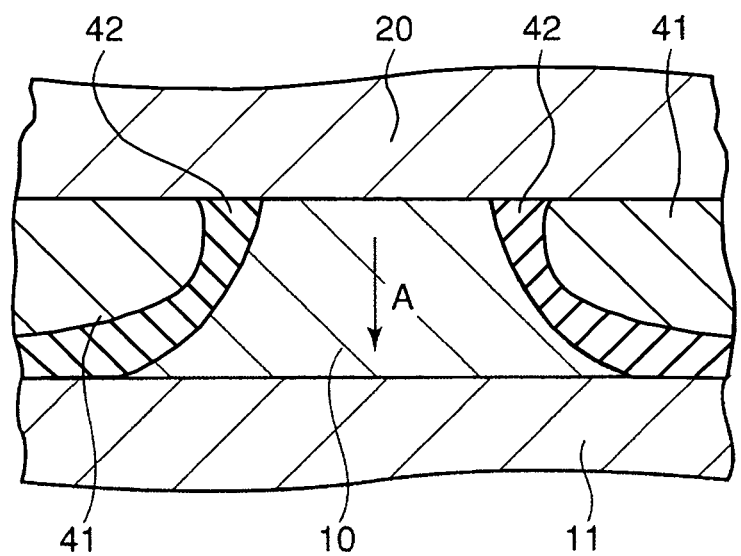
FIG. 16 is a view showing a state that a magnetoresistive effect element according to an embodiment of the present invention is incorporated in a magnetic head.

In the case of an example of FIG. 16 and FIG. 17, which will be described in detail later, the smallest area of the spin-valve film 10 in FIG. 16 is the portion in contact with the upper electrode 20, and thus the width thereof is considered as a track width Tw. Further, regarding a height direction, the portion in contact with the upper electrode 20 is smallest also in FIG. 17, and thus the width thereof is considered as a height length D. The effective area A of the spin-valve film is considered as A=Tw×D.

In the magnetoresistive effect element according to the embodiment of the present invention, the resistance R between electrodes can be 100Ω or lower. This resistance R is a resistance value measured between two electrode pads in a reproducing head portion attached for example on a tip of a head gimbal assembly (HGA).

In the magnetoresistive effect element according to the embodiment of the present invention, when the pinned layer 14 or the free layer 18 has the fcc structure, it is desirable to have fcc (111) orientation perpendicular to the film face. When the pinned layer 14 or the free layer 18 has the bcc structure, it is desirable to have bcc (110) orientation perpendicular to the film face. When the pinned layer 14 or the free layer 18 has the hcp structure, it is desirable to have hcp (001) orientation or hcp (110) orientation perpendicular to the film face.

The crystal orientation property of the magnetoresistive effect element according to the embodiment of the present invention has a dispersion angle of orientation that is preferably 4.0 degree or smaller, more preferably 3.5 degrees or smaller, further more preferably 3.0 degrees or smaller. This is obtained by a half width of a locking curve at a peak position obtained by θ-2θ measurement of X-ray diffraction. Also, it can be detected as a dispersion angle of a spot at a nanodiffraction spot from an element cross-section.

Although depending on the material of the antiferromagnetic film, generally the antiferromagnetic film and the pinned layer 14/spacer layer 16/free layer 18 are different in lattice interval, and thus it is possible to calculate a dispersion angle of orientation in each layer separately. For example, the lattice interval is often different between the platinum-manganese (PtMn) and the pinned layer 14/spacer layer 16/free layer 18. Since the platinum-manganese is a relatively thick film, it is a suitable material for measuring dispersion in orientation direction. Regarding the pinned layer 14/spacer layer 16/free layer 18, the pinned layer 14 and the free layer 18 may be different in the crystal orientation such that they are the bcc structure and the fcc structure. In this case, the pinned layer 14 and the free layer 18 each have a different dispersion angle of crystal orientation.

(Magnetic Head)

Figure 17:
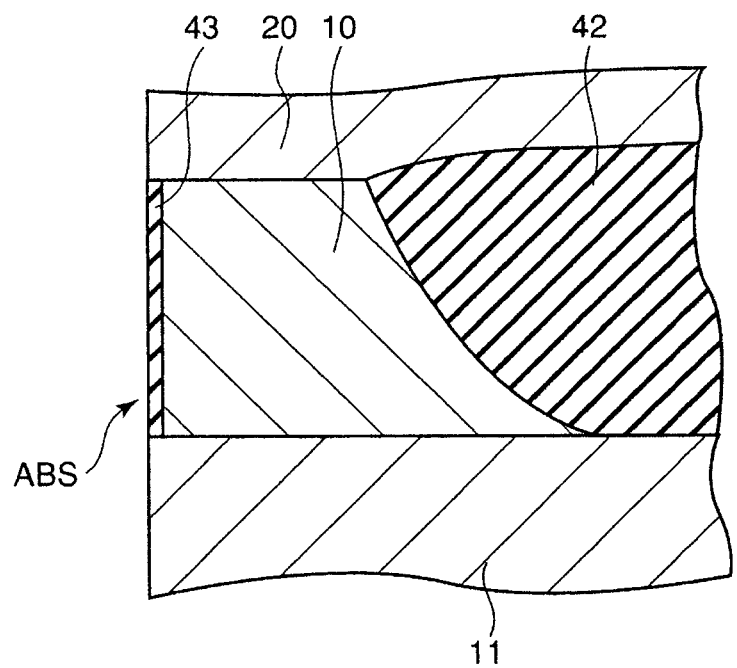
FIG. 17 is a view showing a state that the magnetoresistive effect element according to the embodiment of the present invention is incorporated in the magnetic head.

FIG. 16 and FIG. 17 show a state that the magnetoresistive effect element according to the embodiment of the present invention is incorporated in a magnetic head. FIG. 16 is a cross-sectional view cutting the magnetoresistive effect element in a direction substantially parallel to a medium opposing face to oppose a magnetic recording medium (not shown). FIG. 17 is a cross-sectional view cutting this magnetoresistive effect element in a direction perpendicular to a medium opposing face ABS.

The magnetic head illustrated in FIG. 16 and FIG. 17 has a so-called hard abutted structure. The magnetoresistive effect film 10 is the above-described CCP-CPP film. Above and below the magnetoresistive effect film 10, the lower electrode 11 and the upper electrode 20 are provided respectively. In FIG. 16, on each of side faces of the magnetoresistive effect film 10, a bias magnetic field application film 41 and an insulating film 42 are provided by layering. As shown in FIG. 17, a protection layer 43 is provided on a medium opposing face of the magnetoresistive effect film 10.

The sense current for the magnetoresistive effect film 10 is conducted in a direction substantially perpendicular to a film face as shown by the arrow A in the lower electrode 11 and the upper electrode 20 arranged thereabove and therebelow. Further, by a pair of the bias magnetic field application films 41, a bias magnetic field is applied to the magnetoresistive effect film 10. By this bias magnetic field, magnetic anisotropy of the free layer 18 of the magnetoresistive effect film 10 is controlled to be single anisotropy to stabilize the magnetic structure thereof, thereby suppressing a Barkhausen noise along with movement of a magnetic wall.

The S/N ratio in the magnetoresistive effect film 10 is improved, so that highly sensitive magnetic reproduction becomes possible when it is applied to a magnetic head.

(Hard Disk and Head Gimbal Assembly)

The magnetic head shown in FIG. 16 and FIG. 17 can be incorporated in a recording and reproduction integrated type magnetic head assembly and mounted in a magnetic recording/reproducing apparatus.

Figure 18:
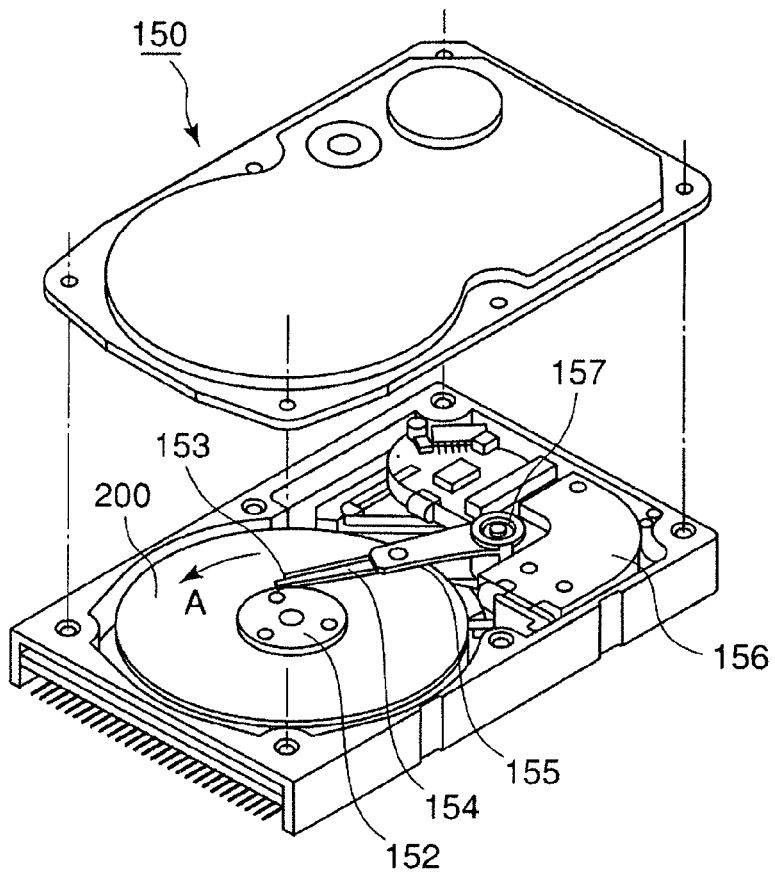
FIG. 18 is a main part perspective view illustrating a schematic structure of a magnetic recording/reproducing apparatus.

FIG. 18 is a main part perspective view illustrating a schematic structure of such a magnetic recording/reproducing apparatus. Specifically, the magnetic recording/reproducing apparatus 150 of this embodiment is an apparatus of the type using a rotary actuator. In this view, a magnetic disk 200 is attached on a spindle 152 and rotates in a direction of the arrow A by a not-shown motor which responds to a control signal from a not-shown drive device control unit. The magnetic recording/reproducing apparatus 150 of this embodiment may have a plurality of magnetic disks 200.

A head slider 153 performing recording/reproducing of information to be stored in the magnetic disk 200 is attached to a tip of a suspension 154 in a thin film form. The head slider 153 mounts near a tip thereof a magnetic head including a magnetoresistive effect element according to any one of the above-described embodiments.

When the magnetic disk 200 rotates, the medium opposing face (ABS) of the head slider 153 is held with a predetermined floating amount from the surface of the magnetic disk 200. Alternatively, it may be of a so-called "contact running type" in which the slider contacts the magnetic disk 200.

The suspension 154 is connected to one end of an actuator arm 155. On the other end of the actuator arm 155, a voice coil motor 156 as a kind of linear motor is provided. The voice coil motor 156 is constituted of a not-shown drive coil wound on a bobbin portion and a magnetic circuit constituted of a permanent magnet and a counter yoke which are arranged to oppose each other so as to sandwich the coil.

The actuator arm 155 is held by not-shown ball bearings provided at two positions above and below the spindle 157, and is capable of rotating and sliding freely by the voice coil motor 156.

Figure 19:
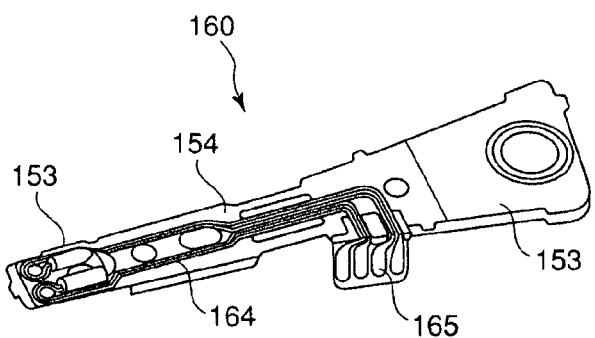
FIG. 19 is an enlarged perspective view showing from a disk side a head gimbal assembly from an actuator arm to a tip thereof.

FIG. 19 is an enlarged perspective view showing from the disk side the head gimbal assembly from the actuator arm 155 to a tip thereof. Specifically, the assembly 160 has the actuator arm 155, and on one end of the actuator arm 155, the suspension 154 is connected. On the tip of the suspension 154, there is attached the head slider 153 having a magnetic head including the magnetoresistive effect element according to any one of the above-described embodiments. The suspension 154 has lead wires 164 for writing and reading a signal, and these lead wires 164 and respective electrodes of the magnetic head incorporated in the head slider 153 are connected electrically. Reference numeral 165 in the view denotes an electrode pad of the assembly 160.

According to this embodiment, by having the magnetic head including the above-described magnetoresistive effect element, it becomes possible to securely read information recorded magnetically with high recording density in the magnetic disk 200.

(Magnetic Memory)

Next, a magnetic memory mounting a magnetoresistive effect element according to an embodiment of the present invention will be described. Specifically, using the magnetoresistive effect element according to the embodiment of the present invention, a magnetic memory such as a magnetic random access memory (MRAM) in which memory cells are arranged in a matrix form for example can be realized.

Figure 20:
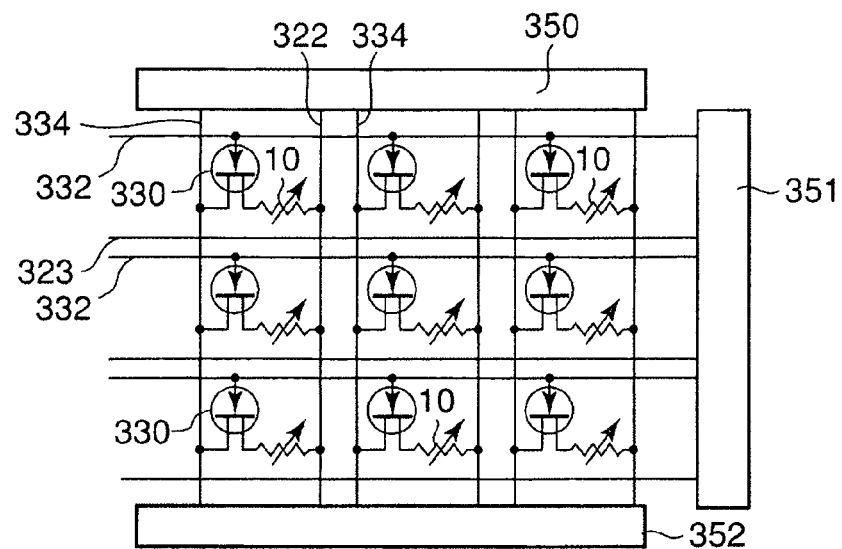
FIG. 20 is a view showing an example of a matrix structure of a magnetic memory according to an embodiment of the present invention.

FIG. 20 is a view showing an example of a matrix structure of a magnetic memory according to the embodiment of the present invention. This view shows a circuit structure of a case that the memory cells are arranged in an array form. For selecting one bit in the array, a column decoder 350 and a row decoder 351 are provided, where a switching transistor 330 turns on by a bit line 334 and a word line 332 to be selected uniquely, and by detection with a sense amplifier 352, bit information recorded in a magnetic recording layer (the free layer 18) in the magnetoresistive effect film 10 can be read. When writing bit information, a write current is passed to a specific writing word line 323 and a bit line 322 to apply a generated magnetic field thereto.

Figure 21:
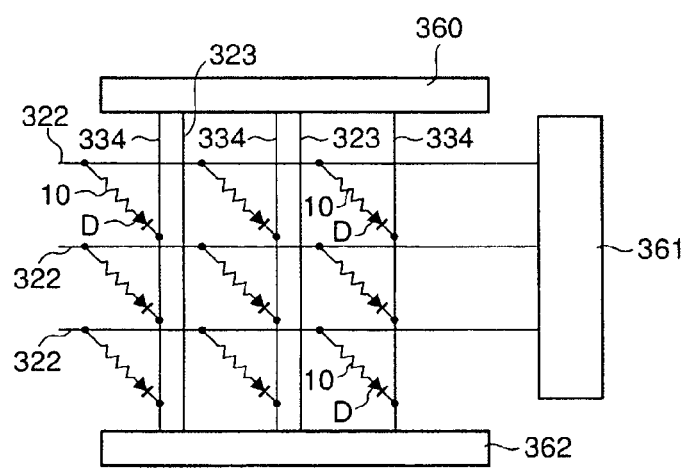
FIG. 21 is a view showing another example of a matrix structure of a magnetic memory according to an embodiment of the present invention.

FIG. 21 is a view showing another example of a matrix structure of a magnetic memory according to an embodiment of the present invention. In this case, a bit line 322 and a word line 334 arranged in a matrix form are selected respectively by decoders 360, 361 to select a specific memory cell in the array. Each memory cell has a structure such that a magnetoresistive effect element 10 and a diode D are connected in series. Here, the diode D has a role to prevent detouring of a sense current in a memory cell other than a selected magnetoresistive effect element 10. Writing is performed by a magnetic field generated by passing write currents to a specific bit line 322 and a writing word line 323 respectively.

Here, it is a structure to perform switching by a current magnetic field, but it may be of a switching method using spin transfer torque. In this case, it is possible to perform switching by changing the direction of a current passed to the magnetoresistive effect element. In this case, a current passed when reading a memory cell is of a small value, and a current passed when switching a memory cell is of a large value.

Figure 22:
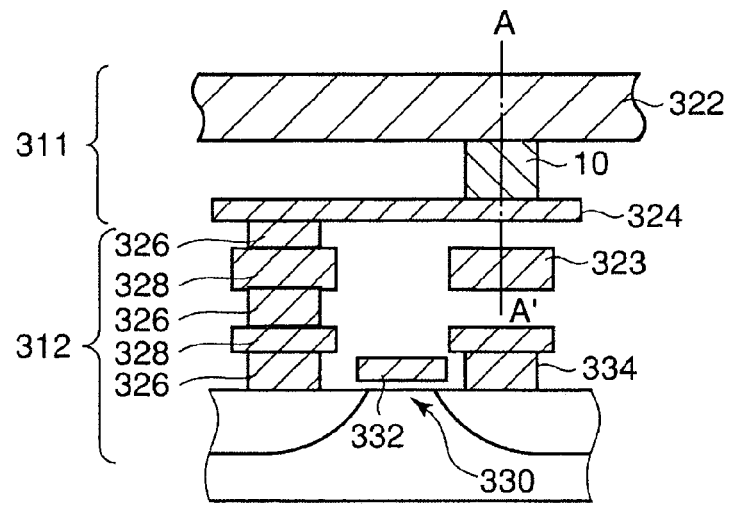
FIG. 22 is a cross-sectional view showing a main part of the magnetic memory according to the embodiment of the present invention.
Figure 23:
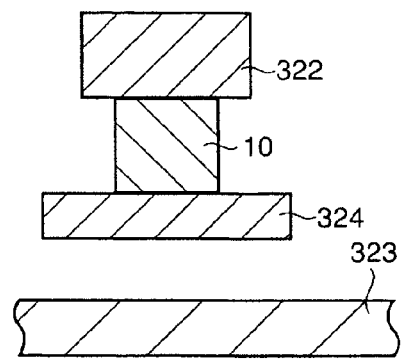
FIG. 23 is a cross-sectional view taken along the A-A' line in FIG. 22.

FIG. 22 is a cross-sectional view showing a main part of a magnetic memory according to the embodiment of the present invention. FIG. 23 is a cross-sectional view taken along the A-A' line in FIG. 22. The structure shown in these views correspond to a memory cell of one bit included in the magnetic memory shown in FIG. 20 or FIG. 21. This memory cell has a memory element part 311 and an address selecting transistor part 312.

The memory element part 311 has the magnetoresistive effect element 10 and a pair of wires 322, 324 connected thereto. The magnetoresistive effect element 10 is the magnetoresistive effect element (CCP-CPP element) according to the above-described embodiment.

On the other hand, the address selecting transistor part 312 is provided with a transistor 330 connected through vias 326 and embedded wires 328. This transistor 330 performs switching operation according to a voltage applied to a gate 332, and controls opening/closing of a current path with the magnetoresistive effect element 10 and the wire 334.

Further, below the magnetoresistive effect element 10, a writing wire 323 is provided in a direction substantially orthogonal to the wire 322. These writing wires 322, 323 can be formed by, for example, aluminum (Al), copper (Cu), tungsten (W), tantalum (Ta) or an alloy including any one of them.

In a memory cell with such a structure, when writing bit information in the magnetoresistive effect element 10, writing pulse currents are passed to the wires 322, 323, and by applying a combined magnetic field induced from these current, magnetization of a recording layer of the magnetoresistive effect element is inverted appropriately.

Further, when reading bit information, a sense current is passed through the wire 322 and the magnetoresistive effect element 10 including the recording layer, and the lower electrode 324, and a resistance value or variation in a resistance value in the magnetoresistive effect element 10 is measured.

The magnetic memory according to the embodiment of the present invention is capable of securely controlling a magnetic domain of a recording layer to assure secure writing, and also capable of performing reading securely, by using the magnetoresistive effect element (CCP-CPP element) according to the above-described embodiment, even when the cell size is miniaturized.

In an MRAM application, the following examples can be implemented.

Ta [5 nm]/Ru [2 nm]/PtMn [15 nm]/CoFe [3.5 nm]/Ru [0.9 nm]/CoFe [3.5 nm]/MgO [1.5 nm]/CoFe [1 nm]/NiFe [1 nm]/ CCP structure of $Al_2O_3$—NiFe/NiFe [1 nm]/crystal growth treatment/NiFe [1 nm]

In the MRAM application, it is also proposed to realize the magnetoresistive effect by a tunnel element and use the CCP structure for enhancing a switching method of the MRAM (H. Meng and J-P. Wang, IEEE Trans Magn. 41 (10), 2612 (2005)). In this case, it is necessary to provide the CCP structure inside the free layer 18, which deteriorates the crystallinity of a remaining layer of the free layer 18 formed on the CCP, thereby causing a problem of dispersion in switching or the like.

In order to realize the CCP structure inserted in the free layer 18, it is preferable that either the above-described PIT/ IAO or the IAO/AIT is performed, and crystal growth treatment is performed to a magnetic layer deposited after the current paths 162 are formed. In this case, the material forming the current paths 162 includes magnetic element, so that the lower metal layer 15 or the upper metal layer 17 is not particularly needed, and the material forming the free layer 18 can be used as it is.

Other Embodiments

Embodiments of the present invention are not limited to the above embodiments and can be expanded or changed, and an embodiment which is expanded or changed is included in the technical range of the present invention.

Regarding a concrete structure of the magnetoresistive effect film, as well as shapes and materials of an electrode, a bias applying film, an insulating film and so forth, a person skilled in the art can make appropriate selection from a publicly known range to thereby implement the present invention in the same manner and obtain the same effect.

For example, when the magnetoresistive effect element is applied to a reproducing magnetic head, magnetic shields can be added on top and bottom of the element to define a detecting resolution of the magnetic head.

Also, the embodiments of the present invention can be applied not only to the longitudinal magnetic recording method but also to a magnetic head or a magnetic reproducing apparatus of a perpendicular magnetic recording method.

Furthermore, the magnetic reproducing apparatus according to the present invention may be of a so-called fixed type which permanently has a specific recording medium, or may be a so-called "removable" type which is capable of replacing a recording medium.

Besides them, all magnetoresistive effect element, magnetic head, magnetic storing/reproducing apparatus and magnetic memory, which can be implemented with appropriately change in design by a person skilled in the art based on the magnetic head and the magnetic recording/reproducing apparatus described above as embodiments of the present invention, belong similarly to the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element, comprising:
   a magnetization fixed layer including a plurality of first crystal grains, having a magnetization direction which is fixed substantially in one direction;
   a magnetization free layer including a plurality of second crystal grains, having a magnetization direction which is changeable; and
   a spacer layer, between the magnetization fixed layer the magnetization free layer, including an insulating layer and a plurality of metal conductors penetrating the insulating layer,
   grain diameters of the second crystal grains being smaller than grain diameters of the first crystal grains,
   the metal conductors having diameters smaller than the grain diameters of both the first and second crystal grains, and
   each metal conductor being arranged in correspondence with a center portion of a corresponding one of the first crystal grains and a center portion of a corresponding one of the second crystal grains.

2. The magnetoresistive effect element according to claim 1, wherein grain diameters of the second crystal grains are 3 nanometers or larger and 10 nanometers or smaller.

3. The magnetoresistive effect element according to claim 1, further comprising
   a first metal layer arranged between the magnetization free layer and the spacer layer, the first metal layer including a first component in common with the metal conductor.

4. The magnetoresistive effect element according to claim 3, wherein the first component includes at least one of copper, gold, and silver.

5. The magnetoresistive effect element according to claim 4, wherein a film thickness of the first metal layer is 0.2 nanometer or larger and 1.5 nanometer or smaller.

6. The magnetoresistive effect element according to claim 3, further comprising
   a second metal layer arranged between the magnetization fixed layer and the spacer layer, the second metal layer including a second component in common with the metal conductor.

7. The magnetoresistive effect element according to claim 6, wherein the second component includes at least one of copper, gold, and silver.

8. The magnetoresistive effect element according to claim 6, wherein a film thickness of the second metal layer is 0.1 nanometer or larger and 1.0 nanometer or smaller.

9. The magnetoresistive effect element according to claim 6, wherein the first metal layer is thicker than the second metal layer.

10. The magnetoresistive effect element according to claim 1, wherein the magnetization fixed layer includes an iron-cobalt layer having a body-centered cubic structure or a cobalt-iron layer having a face-centered cubic structure, and the magnetization free layer includes a cobalt-iron alloy layer.

11. The magnetoresistive effect element according to claim 1, wherein the metal conductor has a diameter of 2 nanometers or larger and 6 nanometers or smaller.

12. The magnetoresistive effect element according to claim 1, wherein the metal conductor has a crystal structure, and the insulating layer has an amorphous structure.

13. The magnetoresistive effect element according to claim 1, wherein the insulating layer includes an oxide, a nitride, or an oxynitride which includes at least one kind of element selected from the group consisting of aluminum, silicon, hafnium, titanium, tantalum, molybdenum, tungsten, niobium, magnesium, chromium, and zirconium.

14. The magnetoresistive effect element according to claim 1, further comprising
   a pair of electrodes which passes a current from the magnetization fixed layer to the magnetization free layer.

15. A magnetic head comprising a magnetoresistive effect element according to claim 14.

16. A magnetic disk apparatus comprising a magnetic head according to claim 15.

17. The magnetoresistive effect element according to claim 1, wherein the grain diameters of the first crystal grains are between 5 and 20 nanometers.

18. The magnetoresistive effect element according to claim 1, wherein each of the magnetization fixed layer and the magnetization free layer has a crystal structure which is at least one of face-centered cubic (111) orientation, body-centered cubic (110) orientation, hexagonal close-packed (001) orientation, and hexagonal close-packed (110) orientation, perpendicular to a face thereof, with a dispersion angle of crystal orientation being 4.0 degrees or less.

19. The magnetoresistive effect element according to claim 1, wherein
   first and second ends of the longest straight line traversing each respective one of the first crystal grains are designated with coordinates 0 and 100, respectively, and the center portion of each respective first crystal grain is defined as an area between coordinates 30 and 70 of that first crystal grain, and
   first and second ends of the longest straight line traversing each respective one of the second crystal grains are designated with coordinates 0 and 100, respectively, and the center portion of each respective second crystal grain is defined as an area between coordinates 30 and 70 of that second crystal grain.

20. The magnetoresistive effect element according to claim 1, wherein a range of grain diameters of the second crystal grains in the vicinity of the metal conductors is different than a range of grain diameters of the second crystal grains in other portions of the magnetization free layer.

* * * * *